United States Patent
Yamada et al.

(10) Patent No.: US 7,248,237 B2
(45) Date of Patent: Jul. 24, 2007

(54) DISPLAY DEVICE AND DISPLAY DEVICE DRIVING METHOD

(75) Inventors: Hiroyasu Yamada, Hachioji (JP); Tomoyuki Shirasaki, Higashiyamato (JP)

(73) Assignee: Casio Computer Co., Ltd., Tokyo (JP)

(*) Notice: Subject to any disclaimer, the term of this patent is extended or adjusted under 35 U.S.C. 154(b) by 139 days.

(21) Appl. No.: 10/492,054

(22) PCT Filed: Aug. 22, 2003

(86) PCT No.: PCT/JP03/10644

§ 371 (c)(1), (2), (4) Date: Apr. 7, 2004

(87) PCT Pub. No.: WO2004/019314

PCT Pub. Date: May 4, 2004

(65) Prior Publication Data

US 2004/0256617 A1    Dec. 23, 2004

(30) Foreign Application Priority Data

Aug. 26, 2002 (JP) .............................. 2002-245444

(51) Int. Cl.
  *G09G 3/30*   (2006.01)
  *G09G 5/00*   (2006.01)

(52) U.S. Cl. ....................................... 345/76; 345/211

(58) Field of Classification Search ............ 345/76–78, 345/82, 92, 211–212, 204; 315/169.1–169.4
See application file for complete search history.

(56) References Cited

U.S. PATENT DOCUMENTS

| | | | |
|---|---|---|---|
| 5,680,149 A | 10/1997 | Koyama et al. | |
| 6,023,259 A * | 2/2000 | Howard et al. | 345/76 |
| 6,091,382 A | 7/2000 | Shioya et al. | |
| 6,166,714 A | 12/2000 | Kishimoto | |
| 6,229,506 B1 * | 5/2001 | Dawson et al. | 345/82 |
| 6,373,454 B1 | 4/2002 | Knapp et al. | |
| 6,522,315 B2 * | 2/2003 | Ozawa et al. | 345/92 |
| 6,577,302 B2 | 6/2003 | Hunter et al. | |
| 6,650,060 B2 | 11/2003 | Okuda | |

(Continued)

FOREIGN PATENT DOCUMENTS

EP    1 146 501 A1    10/2001

(Continued)

*Primary Examiner*—Amr A. Awad
*Assistant Examiner*—Stephen Sherman
(74) *Attorney, Agent, or Firm*—Frishauf, Holtz, Goodman & Chick, P.C.

(57) ABSTRACT

A display device includes a plurality of scanning lines ($X_1$-$X_m$), a plurality of signal lines ($Y_1$-$Y_n$), a scanning driver (5) which sequentially supplies to the scanning lines selection signals that select the scanning lines, a data driver (3) which supplies a designation current to the plurality of signal lines within a selection period when the scanning lines are being selected, a plurality of pixel circuits which supplies a driving current corresponding to a current value of the designation current that flows to the signal lines, a plurality of optical elements ($E_{1,1}$-$E_{m,n}$) which emit light in accordance with the driving current supplied by the plurality of pixel is circuits and a power supply (6) which outputs to the plurality of pixel circuits a driving current reference voltage to supply the driving current.

28 Claims, 12 Drawing Sheets

U.S. PATENT DOCUMENTS

| | | |
|---|---|---|
| 6,734,636 B2 | 5/2004 | Sanford et al. |
| 6,744,414 B2 | 6/2004 | Lee et al. |
| 6,788,003 B2 * | 9/2004 | Inukai et al. ............ 315/169.3 |
| 6,859,193 B1 | 2/2005 | Yumoto |
| 6,900,784 B2 * | 5/2005 | Tsuchida ..................... 345/76 |
| 6,943,759 B2 * | 9/2005 | Tam ............................ 345/76 |
| 2001/0017618 A1 | 8/2001 | Azami |
| 2001/0035863 A1 | 11/2001 | Kimura |
| 2001/0052606 A1 | 12/2001 | Sempel et al. |
| 2002/0014852 A1 | 2/2002 | Bae |
| 2002/0075208 A1 | 6/2002 | Bae et al. |
| 2002/0135309 A1 | 9/2002 | Okuda |
| 2002/0163514 A1 | 11/2002 | Nagai et al. |
| 2002/0195968 A1 | 12/2002 | Sanford et al. |
| 2003/0020335 A1 | 1/2003 | Komiya |
| 2003/0098708 A1 | 5/2003 | Matsueda |
| 2004/0036664 A1 | 2/2004 | Miyazawa |
| 2004/0113873 A1 | 6/2004 | Shirasaki |
| 2004/0165003 A1 | 8/2004 | Shirasaki |
| 2004/0183791 A1 | 9/2004 | Yoshida et al. |
| 2004/0246241 A1 | 12/2004 | Kazuhito et al. |
| 2005/0140610 A1 | 6/2005 | Smith et al. |
| 2005/0157581 A1 | 7/2005 | Shirasaki et al. |
| 2005/0219168 A1 | 10/2005 | Shirasaki et al. |
| 2006/0119552 A1 | 6/2006 | Yumoto |
| 2006/0214890 A1 | 9/2006 | Morishige et al. |

FOREIGN PATENT DOCUMENTS

| | | |
|---|---|---|
| EP | 1 170 718 A1 | 1/2002 |
| EP | 1 372 136 A1 | 12/2003 |
| EP | 1 443 483 A2 | 8/2004 |
| JP | 1-123292 A | 5/1989 |
| JP | 2506840 B2 | 4/1996 |
| JP | 8-330600 A | 12/1996 |
| JP | 11-143429 A | 5/1999 |
| JP | 2000-221942 A | 8/2000 |
| JP | 2001-147659 A | 5/2001 |
| JP | 2002-215095 A | 7/2002 |
| JP | 2003-529805 A | 10/2003 |
| KR | 2000-0071301 A | 11/2000 |
| WO | WO 99/65011 A2 | 12/1999 |
| WO | WO 01/06484 A1 | 1/2001 |
| WO | WO 01/20591 A1 | 3/2001 |
| WO | WO 01/75852 A1 | 10/2001 |
| WO | WO 02/39420 A1 | 5/2002 |
| WO | WO 03/058328 A1 | 7/2003 |
| WO | WO 2004/001714 A1 | 12/2003 |

* cited by examiner

DISPLAY DEVICE AND DISPLAY DEVICE DRIVING METHOD

This application is a U.S. National Phase Application under 35 USC 371 of International Application PCT/JP03/10644 filed Aug. 22, 2003.

TECHNICAL FIELD

The present invention relates to a display device and a display device driving method.

BACKGROUND ART

Liquid crystal displays are generally classified into active matrix driving liquid crystal displays and simple matrix driving liquid crystal displays. The active matrix driving liquid crystal display displays an image having a higher luminance, higher contrast, and higher resolution as compared to the simple matrix driving liquid crystal display. In the active matrix driving liquid crystal display, a liquid crystal element which also functions as a capacitor and a transistor which activates the liquid crystal element are arranged for each pixel. In the active matrix driving liquid crystal display, a selection signal is input from a scanning driver serving as a shift register to a scanning line so that the scanning line is selected. At this time, when a voltage having a level representing a luminance is applied from a data driver to a signal line, the voltage is applied to the liquid crystal element through the transistor. Even when the transistor is turned off during a period from the end of signal input to the scanning line to the next signal input, the voltage level is held until the next signal is input to the scanning line because the liquid crystal element functions as a capacitor. As described above, while the signal is input to the scanning line, the light transmittance of the liquid crystal element is newly refreshed. Light from a backlight passes through the liquid crystal element at the refreshed light transmittance so that the gray level of the liquid crystal display is expressed.

On the other hand, an organic EL (ElectroLuminescence) display which uses organic EL elements as spontaneous optical elements requires no backlight, unlike liquid crystal displays. Hence, the organic EL display is optimum for a thin display. In addition, the organic EL display has no limitation on the angle of field, unlike liquid crystal displays. For this reason, practical utilization of organic EL displays as next-generation display devices is greatly expected.

From the viewpoint of a high luminance, high contrast, and high resolution, voltage-controlled active matrix driving schemes have been developed not only for liquid crystal displays but also for organic EL displays. However, the capacity of an organic EL element is much smaller than that of a liquid crystal element so a current flows to the organic EL element itself. To hold a voltage, the number of transistors increases. This leads to an increase in complexity of a circuit constituted by transistors.

In a transistor, generally, the channel resistance changes due to a change in ambient temperature or long-time use. For this reason, the gate threshold voltage changes over time or varies between transistors. It is therefore difficult to uniquely designate the current level to be supplied to an organic EL element on the basis of the gate voltage level of a switching transistor by changing the value of the voltage to be applied to the gate electrode of the transistor and thus changing the level of the current to be supplied to the organic EL element. In other words, the level of the current to be supplied can hardly be uniquely designated by changing the value of the voltage to be applied to the gate electrode of the transistor and thus changing the luminance of the organic EL element. That is, even when a gate voltage of the same level is applied to the transistors of a plurality of pixels, the organic EL elements of the plurality of pixels may have different emission luminances. This may cause a variation in luminance on the display screen.

DISCLOSURE OF INVENTION

It is an object of the present invention to provide a display device and a display device driving method, which allow stable display on the basis of a simple driving principle.

In order to solve the above problems, according to an aspect of the present invention, there is provided a display device comprising:

a plurality of scanning lines (e.g., selection scanning lines $X_1$ to $X_m$);

a plurality of signal lines (e.g., signal lines $Y_1$ to $Y_n$);

a scanning driver (e.g., a selection scanning driver 5) which sequentially supplies to the scanning lines selection signals that select the scanning lines;

a data driver (e.g., a data driver 3) which supplies a designation current (e.g., a gray level designation current $I_{DATA}$) to the plurality of signal lines within a selection period (e.g., a selection period $T_{SE}$) when the scanning lines are being selected;

a plurality of pixel circuits (e.g., pixel circuits $D_{1,1}$ to $D_{m,n}$) which supplies a driving current corresponding to a current value of the designation current that flows to the signal lines;

a plurality of optical elements (e.g., light-emitting elements $E_{1,1}$ to $E_{m,n}$) which emit light in accordance with the driving current supplied by the plurality of pixel circuits; and a power supply (e.g., a common signal power supply 6) which outputs to the plurality of pixel circuits a driving current reference voltage (e.g., a voltage $V_{HIGH}$) to supply the driving current.

In the above device, in accordance with the timing when the power supply outputs the driving current reference voltage, the plurality of pixel circuits supply the driving current in accordance with the current value of the designation current that flows within each selection period. Accordingly, the optical elements emit light.

Hence, when the power supply outputs the driving current reference voltage from the end of the selection period of a predetermined scanning line till the beginning of the selection period of the next scanning line, a driving current corresponding to both an optical element corresponding to the predetermined scanning line and an optical element corresponding to the next scanning line flows. Hence, the optical elements can emit light at a desired luminance.

When the power supply outputs the driving current reference voltage to the pixel circuit at once after all the scanning lines are selected, all the optical elements can emit light.

When a reset voltage is output to the plurality of signal lines within a period when none of the plurality of optical elements are selected, the signal lines reset charges stored in the preceding selection period. For this reason, the parasitic capacitance of the signal lines can be quickly charged within the next selection period so that even when a designation current having a smaller current value is supplied, the current value of the designation current can rapidly be set in the steady state. Hence, even an optical element such as an organic EL element whose luminance is modulated by a small current on the μA order is allowed to quickly display multiple gray level luminances.

BEST MODE FOR CARRYING OUT THE INVENTION

Detailed embodiments of the present invention will be described below with reference to the accompanying drawings. The scope and spirit of the display device or panel are not limited to the illustrated embodiments.

FIRST EMBODIMENT

Figure 1:
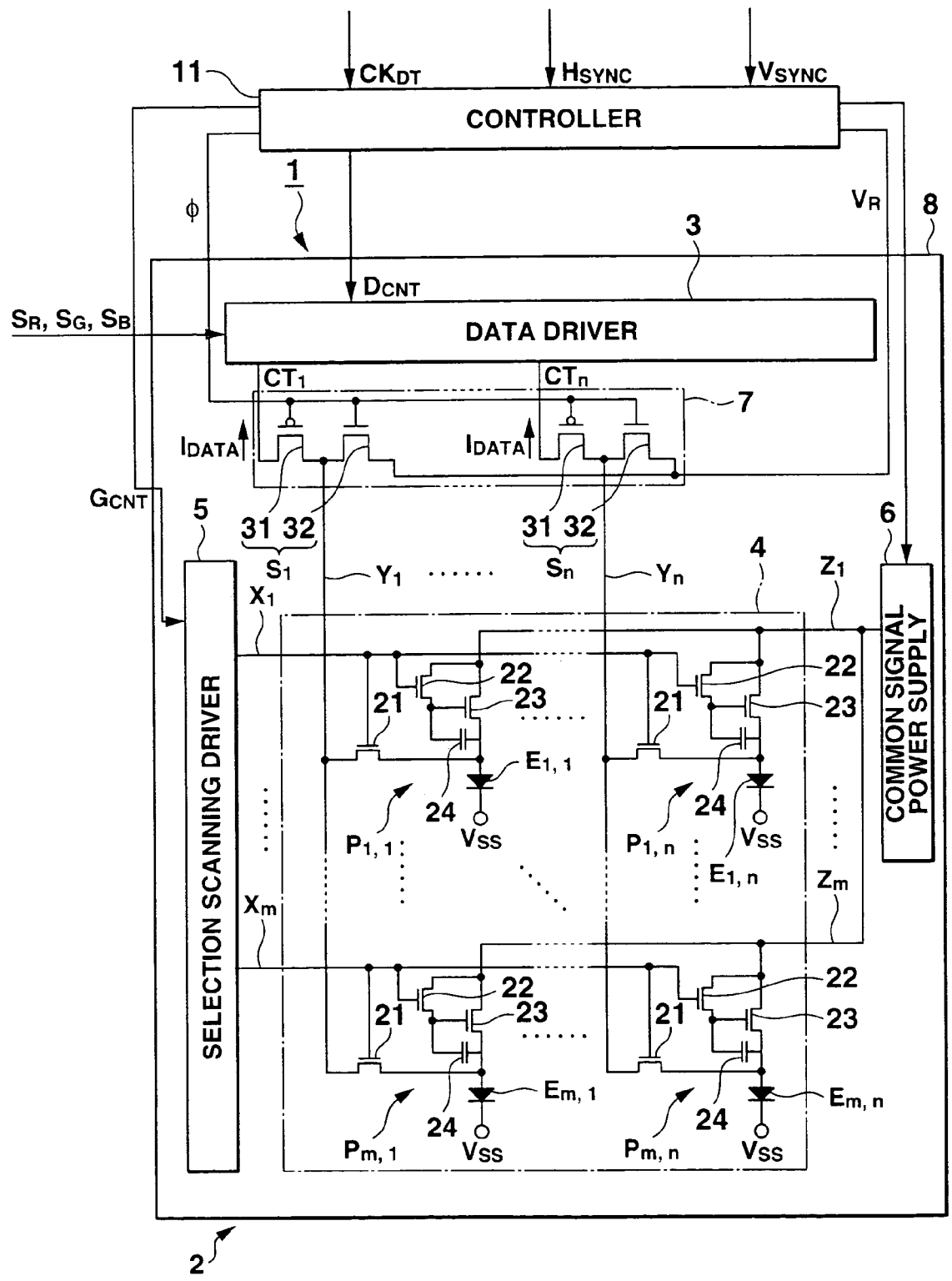
FIG. 1 is a view showing an organic EL display applied as a display device according to the first embodiment of the present invention.

FIG. 1 is a view showing an organic EL display to which the present invention is applied. An organic EL display 1 comprises, as a basic arrangement, an organic EL display panel 2, data driver 3, selection scanning driver 5, common signal power supply 6, switching circuit 7, and controller 11.

In the organic EL display panel 2, a display section 4 on which an image is actually displayed is formed on a transparent substrate 8. The data driver 3, selection scanning driver 5, common signal power supply 6, and switching circuit 7 are arranged around the display section 4. The data driver 3, selection scanning driver 5, and common signal power supply 6 may be arranged either on the transparent substrate 8 or on a flexible circuit board arranged around the transparent substrate 8.

In the display section 4, (m×n) pixels $P_{1,1}$ to $P_{m,n}$ (m and n are arbitrary natural numbers) are arranged in a matrix on the transparent substrate 8. In the column direction, i.e., in the vertical direction, m pixels $P_{1,j}$ to $P_{m,j}$ (j is an arbitrary natural number; $1 \leq j \leq n$) are arrayed. In the row direction, i.e., in the horizontal direction, n pixels $P_{i,1}$ to $P_{i,n}$ (i is an arbitrary natural number; $1 \leq i \leq m$) are arrayed. That is, a pixel which exists on the ith line (i.e., the ith row) from the upper side in the vertical direction and the jth line (i.e., the jth column) from the left side in the horizontal direction is defined as a pixel $P_{i,j}$.

In the display section 4, m selection scanning lines $X_1$ to $X_m$ running in the row direction are parallelly arranged in the column direction on the transparent substrate 8. In addition, m common signal supply lines $Z_1$ to $Z_m$ running in the row direction are parallelly arranged in the column direction on the transparent substrate 8 in correspondence with the selection scanning lines $X_1$ to $X_m$. Each common signal supply line $Z_k$ ($1 \leq k \leq m-1$) is inserted between the selection scanning lines $X_k$ and $X_{k+1}$. The selection scanning line $X_m$ is inserted between the common signal supply lines $Z_{m-1}$ and $Z_m$. In addition, n signal lines $Y_1$ to $Y_n$ running in the column direction are parallelly arranged in the row direction on the transparent substrate 8. The selection scanning lines $X_1$ to $X_m$, common signal supply lines $Z_1$ to $Z_m$, and signal lines $Y_1$ to $Y_n$ are insulated from each other by intervening insulating films. A selection scanning line $X_i$ and common signal supply line $Z_i$ are connected to n pixels $P_{i,1}$ to $P_{i,n}$ arrayed in the row direction. A signal line $Y_j$ is connected to m pixels $P_{1,j}$ to $P_{m,j}$ arrayed in the column direction. The pixel $P_{i,j}$ is arranged at a portion surrounded by the selection scanning line $X_i$, common signal supply line $Z_i$, and signal line $Y_j$. The selection scanning lines $X_1$ to $X_m$ are connected to the output terminals of the selection scanning driver 5. The common signal supply lines $Z_1$ to $Z_m$ are rendered conductive to each other and connected to the output terminal of the common signal power supply 6. That is, the same signal is output to the common signal supply lines $Z_1$ to $Z_m$.

Figure 2:
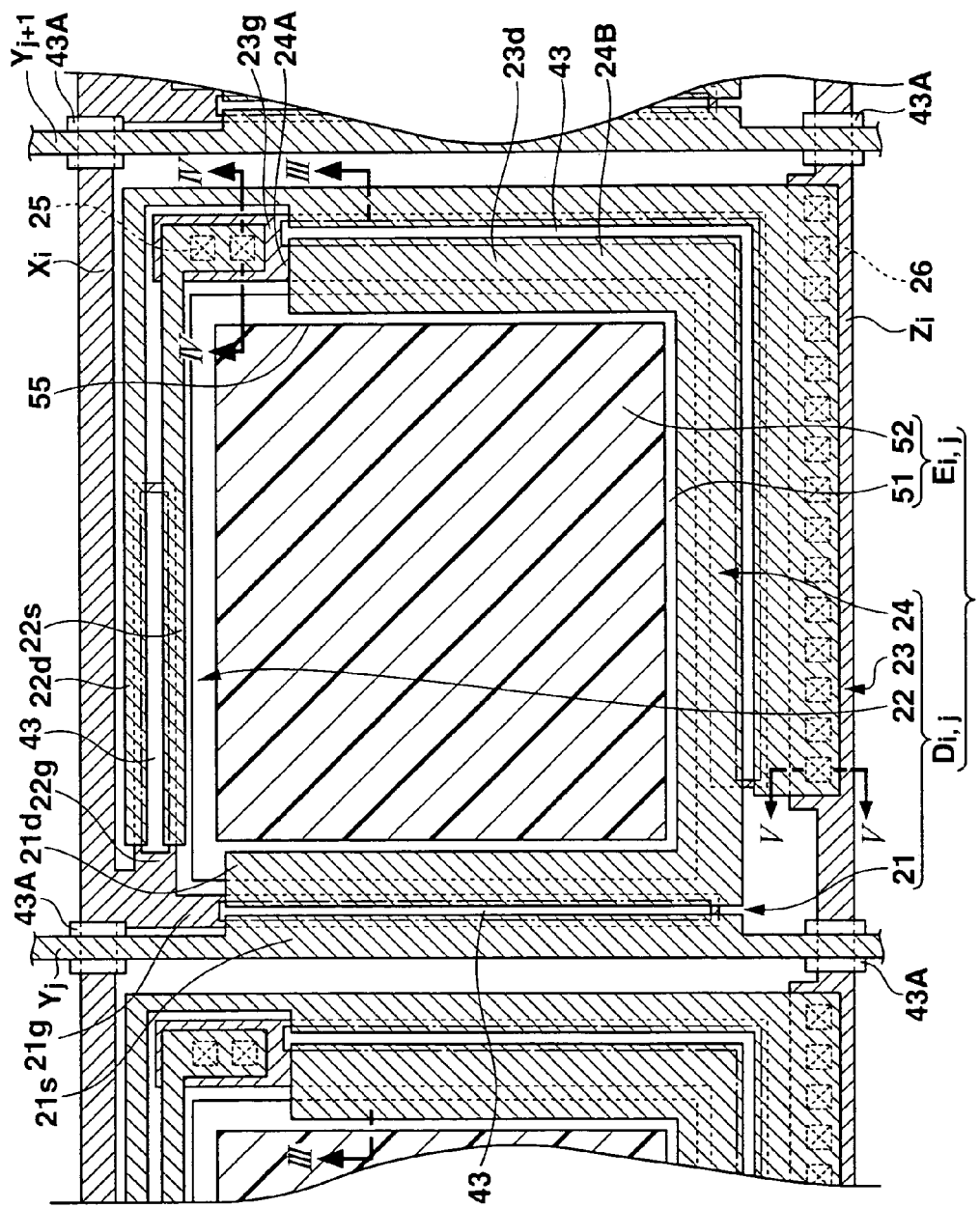
FIG. 2 is a plan view showing a pixel shown in FIG. 1, in which an oxide insulating film, channel protective insulating film, and common electrode are omitted to help understanding.
Figure 3:
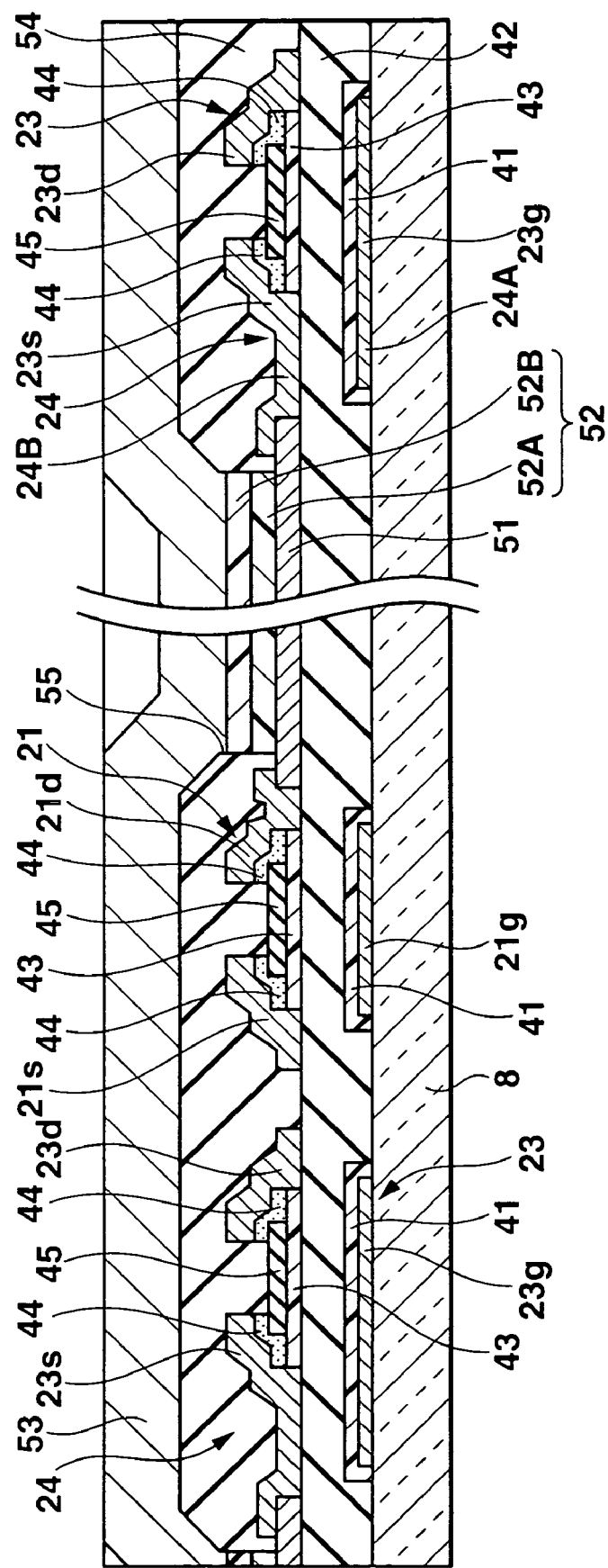
FIG. 3 is a sectional view taken along a line III-III in FIG. 2.
Figure 4:
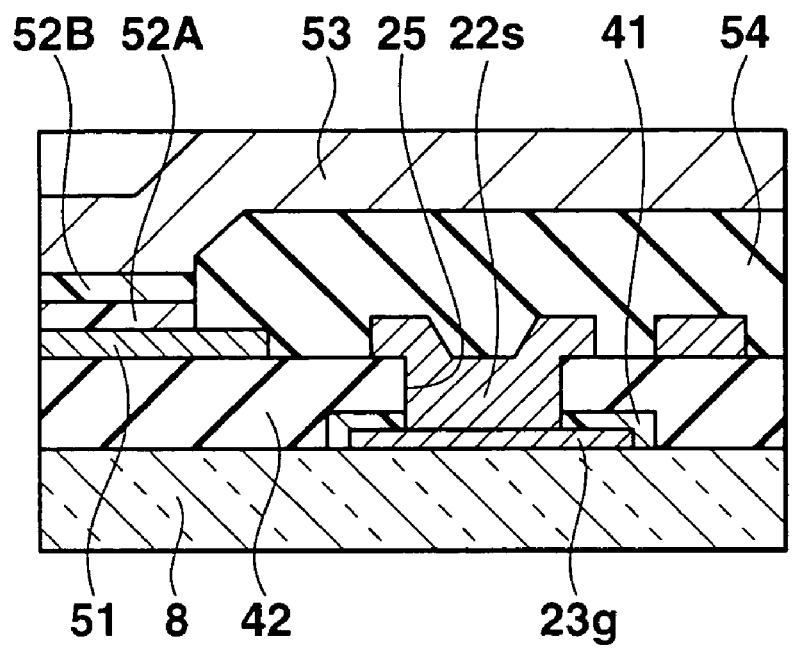
FIG. 4 is a sectional view taken along a line IV-IV in FIG. 2.
Figure 5:
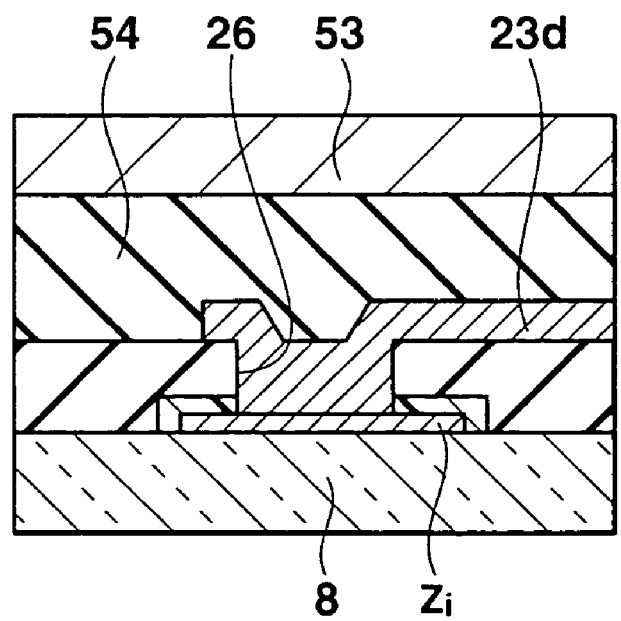
FIG. 5 is a sectional view taken along a line V-V in FIG. 2.

The pixel $P_{i,j}$ will be described next with reference to FIGS. 2 to 6. FIG. 2 is a plan view showing the pixel $P_{i,j}$. To help understanding, an oxide insulating film 41, channel protective insulating film 45, and common electrode 53 (to be described later) are omitted. FIG. 3 is a sectional view taken along a line III-III in FIG. 2. FIG. 4 is a sectional view taken along a line IV-IV in FIG. 2. FIG. 5 is a sectional view taken along a line V-V in FIG. 2.

Figure 6:
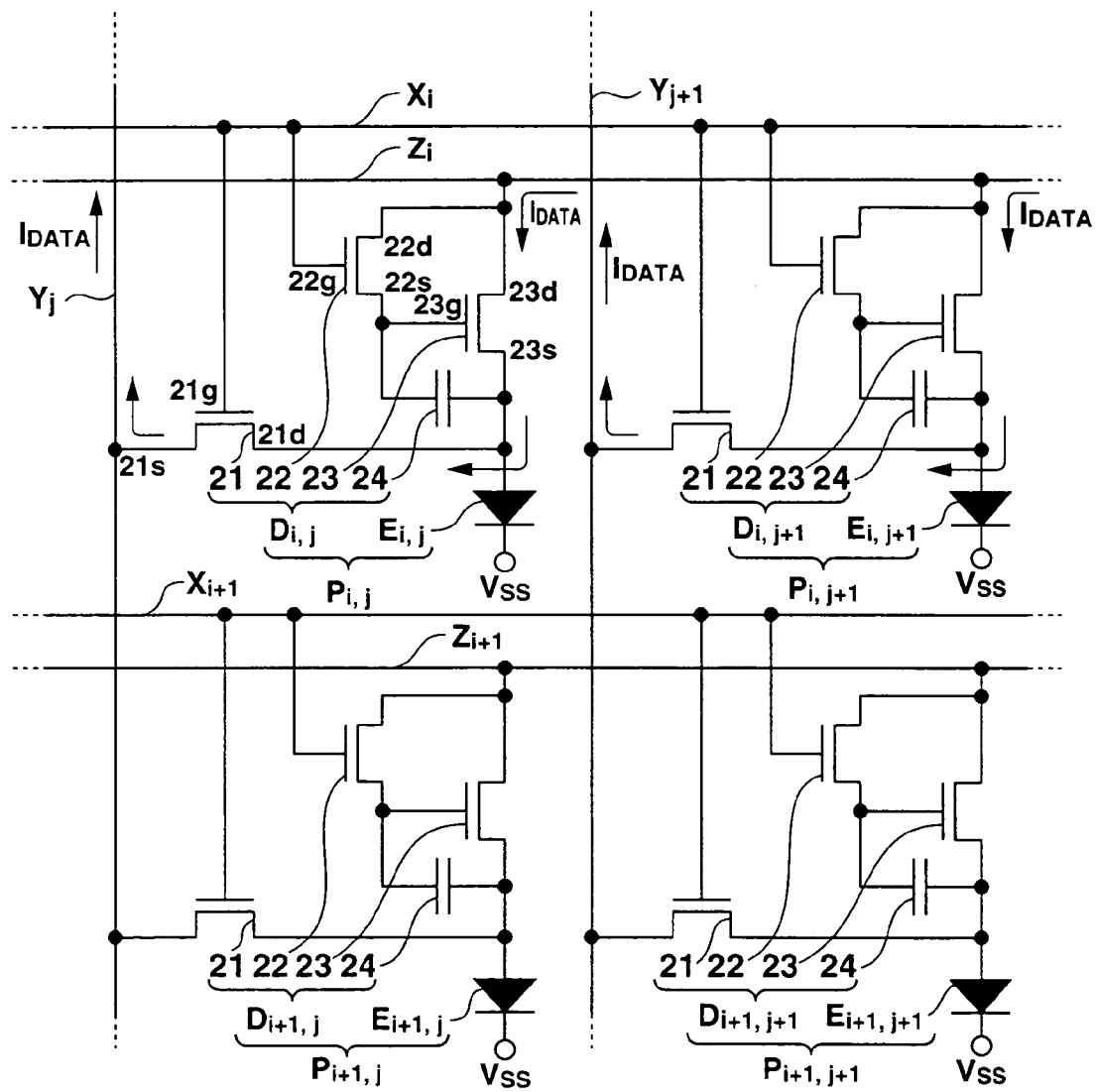
FIG. 6 is an equivalent circuit diagram of four adjacent pixels.

FIG. 6 is an equivalent circuit diagram of four adjacent pixels $P_{i,j}$, $P_{i+1,j}$, $P_{i,j+1}$, and $P_{i+1,j+1}$.

The pixel $P_{i,j}$ is constituted by a light-emitting element $E_{i,j}$ which emits light with a luminance (nt.=cd/m²) corresponding to the current value of the driving current and a pixel circuit $D_{i,j}$ which is arranged around the light-emitting element $E_{i,j}$ and drives the light-emitting element $E_{i,j}$. The pixel circuit $D_{i,j}$ holds the current value of a current that flows to the light-emitting element $E_{i,j}$ during a predetermined light-emitting period on the basis of a voltage signal and current output from the data driver 3, selection scanning driver 5, power supply scanning driver 6, and switching circuit 7. With this operation, the luminance of the light-emitting element $E_{i,j}$ is held at a predetermined value during a predetermined period.

The light-emitting element $E_{i,j}$ is made of an organic EL element. The light-emitting element $E_{i,j}$ has a multilayered structure formed by sequentially stacking a pixel electrode 51, an organic EL layer 52, and the common electrode 53. The pixel electrode 51 functions as an anode on the transparent substrate 8. The organic EL layer 52 has a function of receiving holes and electrons by an electric field and a function of transporting holes and electrons. The organic EL layer 52 has a recombination region where the transported holes and electrons are recombined and a light-emitting region where light is emitted by capturing excitons generated upon recombination. The organic EL layer 52 functions as a light-emitting layer in a broad sense. The common electrode 53 functions as a cathode.

The pixel electrode 51 is patterned and separated for each pixel $P_{i,j}$ in each surrounded region surrounded by the signal lines $Y_1$ to $Y_n$ and selection scanning lines $X_1$ to $X_m$. The peripheral edge of the pixel electrode 51 is covered with an interlayer dielectric film 54 which has a layer of silicon nitride or silicon oxide that covers three transistors 21, 22, and 23 of the pixel circuit $D_{i,j}$. The upper surface at the center of the pixel electrode 51 is exposed through a contact hole 55 in the interlayer dielectric film 54. The interlayer dielectric film 54 may also have a second layer formed of an insulting film of polyimide or the like on the first layer of silicon nitride or silicon oxide.

The pixel electrode 51 has conductivity and transmittance to visible light. The pixel electrode 51 preferably has a relatively high work function and efficiently injects holes into the organic EL layer 52. For example, the pixel electrode 51 contains, as a principal component, indium tin oxide (ITO), indium zinc oxide, indium oxide ($In_2O_3$), tin oxide ($SnO_2$), or zinc oxide (ZnO).

The organic EL layer 52 is formed on each pixel electrode 51. The organic EL layer 52 is also patterned for each pixel $P_{i,j}$. The organic EL layer 52 contains a light-emitting material (phosphor) as an organic compound. The light-emitting material may be either a polymeric material or a low molecular weight material. The organic EL layer 52 may have, e.g., a two-layered structure in which a hole transport layer 52A and a light-emitting layer 52B in a narrow sense are formed sequentially from the side of the pixel electrode 51, as shown in FIG. 3. The light-emitting layer 52B has a recombination region where holes and electrons are recombined and a light-emitting region where light is emitted by capturing excitons generated upon recombination. Alternatively, the organic EL layer 52 may have a three-layered structure in which a hole transport layer, a light-emitting layer in a narrow sense, and electron transport layer are formed sequentially from the side of the pixel electrode 51. The organic EL layer 52 may have a single-layered structure including a light-emitting layer in a narrow sense. The organic EL layer 52 may also have a multilayered structure formed by interposing an electron or hole injection layer between appropriate layers of the above layer structure. The organic EL layer 52 may have any other layer structure.

The organic EL display panel 2 is capable of full-color display or multi-color display. In this case, the organic EL layer 52 of each of the pixels $P_{i,1}$ to $P_{i,n}$ is formed of a light-emitting layer in a broad sense, which has a function of emitting one of, e.g., red light, green light, and blue light. That is, when the pixels $P_{i,1}$ to $P_{i,n}$ selectively emit red, green, and blue light, a color tone is displayed by appropriately synthesizing the colors.

The organic EL layer 52 is preferably made of an organic compound that is electronically neutral. In this case, holes and electrons are injected and transported in the organic EL layer 52 in good balance. In addition, an electron transportable substance may be appropriately mixed into the light-emitting layer in a narrow sense. A hole transportable substance may be appropriately mixed into the light-emitting layer in a narrow sense. An electron transportable substance and a hole transportable substance may be appropriately mixed into the light-emitting layer in a narrow sense. A charge transport layer serving as an electron transport layer or a hole transport layer may be caused to function as a recombination region. Light may be emitted by mixing phosphor into the charge transport layer.

The common electrode 53 formed on the organic EL layer 52 is a single electrode connected to all the pixels $P_{1,1}$ to $P_{m,n}$. Alternately, the common electrode 53 may comprise a plurality of stripe-shaped electrodes connected to the respective columns. More specifically, the common electrode 53 may comprise a stripe common electrode connected to a group of pixels $P_{1,h-1}$ to $P_{m,h-1}$ (h is an arbitrary natural number; $2 \leq h \leq n$) in the column direction, a stripe common electrode connected to a group of pixels $P_{1,h}$ to $P_{m,h}$. In this manner, the common electrode 53 comprises a plurality of stripe-shaped electrodes each connected to each column. Alternatively, the common electrode 53 may comprise a stripe common electrode connected to a group of pixels $P_{g-1,1}$ to $P_{g-1,n}$ (g is an arbitrary natural number; $2 \leq g \leq m$) in the row direction, a stripe common electrode connected to a group of pixels $P_{g,1}$ to $P_{g,n}$, . . . . In this manner, the common electrode 53 comprises a plurality of stripe-shaped electrodes connected to each row.

In any case, the common electrode 53 is electrically insulated from the selection scanning line $X_i$, signal line $Y_j$, and common signal supply line $Z_i$. The common electrode 53 is made of a material having a low work function. For example, the common electrode 53 is made of a single element or an alloy containing at least one of indium, magnesium, calcium, lithium, barium, and rare-earth metals. The common electrode 53 may have a multilayered structure formed by stacking a plurality of layers made of the above materials. More specifically, the multilayered structure may include a high purity barium layer which has a low work function and is formed on the side of the interface that is in contact with the organic EL layer 52, and an aluminum layer that covers the barium layer. Alternatively, the multilayered structure may have a lithium layer on the lower side and an aluminum layer on the upper side. When a transparent electrode is used as the pixel electrode 51, and light emitted from the organic EL layer 52 of the organic EL display panel 2 should exit from the side of the transparent substrate 8 through the pixel electrode 51, the common electrode 53 preferably shields the light emitted from the organic EL layer 52. More preferably, the common electrode 53 has a high reflectance against the light emitted from the organic EL layer 52.

As described above, in the light-emitting element $E_{i,j}$ having a multilayered structure, when a forward bias voltage is applied between the pixel electrode 51 and the common electrode 53, holes are injected from the pixel electrode 51 to the organic EL layer 52 while electrons are injected from the common electrode 53 to the organic EL layer 52. The holes and electrons are transported in the organic EL layer 52. When the holes and electrons are recombined in the organic EL layer 52, excitons are generated. The excitons excite the organic EL layer 52. The organic EL layer 52 emits light.

The emission luminance (unit: nt.=cd/m$^2$) of the light-emitting element $E_{i,j}$ depends on the current value of the current that flows to the light-emitting element $E_{i,j}$. To maintain a predetermined emission luminance of the light-emitting element $E_{i,j}$ during the light-emitting of the light-emitting element $E_{i,j}$ or obtain an emission luminance corresponding to the current value of a gray level designation current $I_{DATA}$ drawn from the data driver 3, the pixel circuit $D_{i,j}$ is arranged around the light-emitting element $E_{i,j}$ of each pixel $P_{i,j}$. The pixel circuit $D_{i,j}$ controls the current value of the light-emitting element $E_{i,j}$.

Each pixel circuit $D_{i,j}$ comprises three transistors 21, 22, and 23 and a capacitor 24. Each transistor is formed of a field effect thin film transistor (TFT) having an N-channel MOS structure.

Each transistor 21 is an MOS field effect transistor constituted by a gate electrode 21g, gate insulating film 42, semiconductor layer 43, source electrode 21s, and drain electrode 21d. Each transistor 22 is an MOS field effect transistor constituted by a gate electrode 22g, gate insulating film 42, semiconductor layer 43, source electrode 22s, and drain electrode 22d. Each transistor 23 is constituted by a gate electrode 23g, gate insulating film 42, semiconductor layer 43, source electrode 23s, and drain electrode 23d.

More specifically, as shown in FIG. 3, the first transistor 21 is a reverse stagger type transistor comprising the gate electrode 21g, oxide insulating film 41, gate insulating film 42, island-shaped semiconductor layer 43, channel protective insulating film 45, impurity-doped semiconductor layers 44, source electrode 21s, and drain electrode 21d. The gate electrode 21g is made of aluminum and formed on the transparent substrate 8. The oxide insulating film 41 is formed by anodizing aluminum that covers the gate electrode 21g. The gate insulating film 42 is made of silicon nitride or silicon oxide and covers the oxide insulating film 41. The semiconductor layer 43 is formed on the gate insulating film 42. The channel protective insulating film 45 is made of silicon nitride and formed on the gate insulating film 42. The impurity-doped semiconductor layers 44 are made of n$^+$-silicon and formed at both ends of the semiconductor layer 43. The source electrode 21s and drain electrode 21d are made of a material selected from chromium, a chromium alloy, aluminum and an aluminum alloy, and formed on the impurity semiconductor layers 44.

The second and third transistors 22 and 23 have the same structure as that of the first transistor 21 described above. However, the shapes, sizes, and dimensions of the transistors 21, 22, and 23, and the channel widths and channel lengths of the semiconductor layers 43 are appropriately set in accordance with the functions of the transistors 21, 22, and 23.

The transistors 21, 22, and 23 may be formed simultaneously by the same process. In this case, the gate electrodes, oxide insulating films 41, gate insulating films 42, semiconductor layers 43, impurity semiconductor layers 44, source electrodes, and drain electrodes of the transistors 21, 22, and 23 have the same compositions.

Even when the semiconductor layers 43 of the transistors 21, 22, and 23 are made of amorphous silicon, they can be sufficiently driven. However, the semiconductor layers 43 may be made of polysilicon. The structures of the transistors 21, 22, and 23 are not limited to the reverse stagger type. Even a stagger type or coplanar type structure may be employed.

Each capacitor 24 is constituted by an electrode 24A, electrode 24B, and dielectric body. The electrode 24A is connected to the gate electrode 23g of the third transistor 23. The electrode 24B is connected to the source electrode 23s of the transistor 23. The dielectric body has the gate insulating film 42 interposed between the electrodes 24A and 24B. The capacitor 24 stores charges between the source electrode 23s and the drain electrode 23d of the transistor 23.

As shown in FIG. 6, in the second transistor 22 of each of the pixel circuit $D_{i,1}$ to $D_{i,n}$ of the ith row, the gate electrode 22g is connected to the selection scanning line $X_i$ of the ith row. The drain electrode 22d is connected to the common signal supply line $Z_i$ of the ith row. As shown in FIG. 5, the drain electrode 23d of the third transistor 23 of each of the pixel circuit $D_{i,1}$ to $D_{i,n}$ of the ith row is connected to the common signal supply line $Z_i$ of the ith row through a contact hole 26. The gate electrode 21g of the first transistor 21 of each of the pixel circuit $D_{i,1}$ to $D_{i,n}$ of the ith row is connected to the selection scanning line $X_i$ of the ith row. The source electrode 21s of the transistor 21 of each of the pixel circuit $D_{1,j}$ to $D_{m,j}$ of the jth column is connected to the signal line $Y_j$ of the jth column.

In each of the pixels $P_{1,1}$ to $P_{m,n}$, the source electrode 22s of the second transistor 22 is connected to the gate electrode 23g of the third transistor 23 through a contact hole 25 formed in the gate insulating film 42, as shown in FIG. 4. The source electrode 22s is also connected to one electrode of the capacitor 24. The source electrode 23s of the transistor 23 is connected to the other electrode of the capacitor 24 and also to the drain electrode 21d of the transistor 21. The source electrode 23s of the transistor 23, the other electrode of the capacitor 24, and the drain electrode 21d of the transistor 21 are connected to the pixel electrode 51 of the light-emitting element $E_{i,j}$. The voltage of the common electrode 53 of the light-emitting element $E_{i,j}$ is a reference voltage $V_{SS}$. In this embodiment, the common electrode 53 of all light-emitting elements $E_{1,1}$ to $E_{m,n}$ is grounded so that the reference voltage $V_{SS}$ is set to 0 [V].

Protective films 43A formed by patterning the same film as that of the semiconductor layers 43 of the transistors 21 to 23 are arranged between the selection scanning line $X_i$ and the signal line $Y_j$ and between the common signal supply line $Z_i$ and the signal line $Y_j$ as well as the gate insulating film 42.

The controller 11 outputs a control signal group $D_{CNT}$ including a data driver clock signal CK1, start signal ST1 and latch signal L to the data driver 3 on the basis of a dot clock signal $CK_{DT}$, horizontal sync signal $H_{SYNC}$ and vertical sync signal $V_{SYNC}$, which are input from the outside. The controller 11 also outputs a control signal group $G_{CNT}$ including a selection scanning driver clock signal CK2 and start signal ST2. The controller 11 also outputs a common signal clock signal CK3 to the common signal power supply 6. The controller 11 also supplies a reset voltage $V_{RST}$ to the switching circuit 7 and outputs a switching signal φ to the switching circuit 7.

More specifically, the data driver clock signal CK1 is a signal to sequentially shift the selected column in synchronism with the dot clock signal $CK_{DT}$. An 8-bit red digital gray level image signal $S_R$, green digital gray level image signal $S_G$, and blue digital gray level image signal $S_B$ are received from an external circuit at the timing of the clock signal CK1. The start signal ST1 is a signal to return the selected column to the first column in synchronism with the horizontal sync signal $H_{SYNC}$. The latch signal L is a signal to parallelly supply the analog gray level designation current $I_{DATA}$ based on an analog gray level designation signal to the signal lines $Y_1$ to $Y_n$. The analog gray level designation signal is obtained by causing the D/A converter in the data driver 3 to D/A-convert the data of one row, i.e., the red digital gray level image signal $S_R$, green digital gray level image signal $S_G$, and blue digital gray level image signal $S_B$ which are received in correspondence with the pixels $P_{i,1}$ to $P_{i,n}$.

The selection scanning driver clock signal CK2 is a signal to sequentially shift the selected row in synchronism with the horizontal sync signal $H_{SYNC}$. The start signal ST2 is a signal to return the selected row to the first row in synchronism with the vertical sync signal $V_{SYNC}$.

The common signal clock signal CK3 is a clock signal to output a common signal to the common signal supply lines $Z_1$ to $Z_m$.

The data driver 3, selection scanning driver 5, and common signal power supply 6 arranged around the display section 4 will be described next.

The selection scanning driver 5 is a so-called shift register in which m flip-flop circuits are connected in series. The driver 5 outputs a selection signal to the selection scanning lines $X_1$ to $X_m$. That is, in accordance with the selection scanning driver clock signal CK2 received from the controller 11, the selection scanning driver 5 sequentially outputs a selection signal of ON level (high level) to the selection scanning lines $X_1$ to $X_m$ in this order (the selection scanning line $X_1$ follows the selection scanning line $X_m$), thereby sequentially selecting the selection scanning lines $X_1$ to $X_m$.

Figure 8:
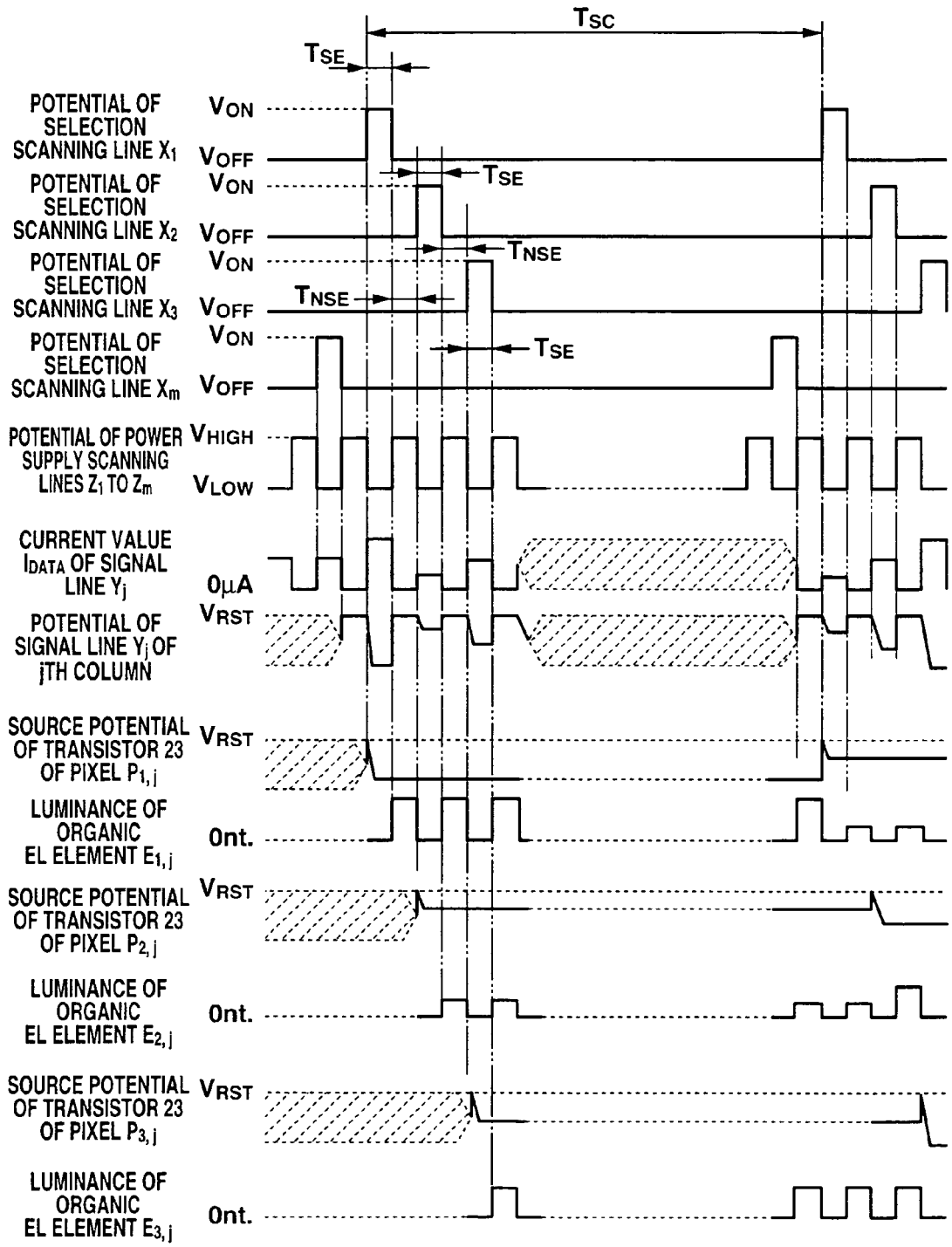
FIG. 8 is a timing chart showing the levels of signals in the apparatus according to the first embodiment.

More specifically, as shown in FIG. 8, the selection scanning driver 5 individually applies, to the selection scanning lines $X_1$ to $X_m$, one of an ON voltage $V_{ON}$ (e.g., much higher than the reference voltage $V_{SS}$) as a high-level selection signal and an OFF voltage $V_{OFF}$ (e.g., equal to or lower than the reference voltage $V_{SS}$) as a low-level selection signal, thereby selecting each selection scanning line $X_i$ at a predetermined period.

During a selection period $T_{SE}$ when the selection scanning line $X_i$ is to be selected, the selection scanning driver 5 applies the ON voltage $V_{ON}$ as a selection signal of ON level (high level) to the selection scanning line $X_i$. Accordingly, the transistors 21 and 22 (the transistors 21 and 22 of all the pixel circuits $D_{i,1}$ to $D_{i,n}$) connected to the selection scanning line $X_i$ are turned on. When the first transistor 21 is turned on, the current that flows to the signal line $Y_j$ can flow to the pixel circuit $D_{i,j}$. On the other hand, a non-selection period $T_{NSE}$ is present from the end of the selection period $T_{SE}$ of the selection scanning line $X_i$ of the ith row till the beginning of the selection period $T_{SE}$ of the selection scanning line $X_{i+1}$ of the (i+1)th row. When the selection scanning driver 5 applies the OFF voltage $V_{OFF}$ of low level to all the selection scanning lines $X_1$ to $X_m$, the transistors 21 and 22 of all the selection scanning lines $X_1$ to $X_m$ are turned off. When the transistor 21 is turned off, supply of the gray level designation current $I_{DATA}$ to the signal line $Y_j$ is stopped. The period from the start of the selection period $T_{SE}$ of the selection scanning line $X_1$ of the first row to the start of the next selection period $T_{SE}$ of the selection scanning line $X_1$ of the first row is defined as one scanning period $T_{SC}$. The selection periods $T_{SE}$ of the selection scanning lines $X_1$ to $X_m$ do not overlap each other.

The common signal power supply 6 is an independent power supply to supply a stable rated voltage to all the common signal supply lines $Z_1$ to $Z_m$. The common signal power supply 6 outputs a signal having a phase corresponding to the common signal clock signal CK3 to the common signal supply lines $Z_1$ to $Z_m$. While the selection scanning driver 5 is applying the ON voltage $V_{ON}$ to one of all the selection scanning lines $X_1$ to $X_m$ as a selection signal, i.e., during the selection period $T_{SE}$, the common signal power supply 6 outputs a low-level voltage $V_{LOW}$ to all the common signal supply lines $Z_1$ to $Z_m$ as a reference potential for the gray level designation current. During the non-selection period $T_{NSE}$ from the end of the selection period $T_{SE}$ of the selection scanning line $X_i$ of the ith row till the beginning of the selection period $T_{SE}$ of the selection scanning line $X_{i+1}$ of the (i+1)th row, the common signal power supply 6 outputs a high-level voltage $V_{HIGH}$ as a reference potential for a driving current. Hence, when the common signal from the common signal power supply 6 is the voltage $V_{LOW}$, the selection scanning driver 5 outputs the selection signal of the ON voltage $V_{ON}$ to one selection scanning line $X_i$ of the selection scanning lines $X_1$ to $X_m$. The selection scanning driver 5 outputs the selection signal of the OFF voltage $V_{OFF}$ to the selection scanning lines $X_1$ to $X_m$ except the selection scanning line $X_i$. When the common signal output from the common signal power supply 6 drops from the high-level voltage $V_{HIGH}$ to the low-level voltage $V_{LOW}$, the selection signal output from the selection scanning driver 5 to one of the selection scanning lines $X_1$ to $X_m$ rises. When the common signal output from the common signal power supply 6 rises from the low-level voltage $V_{LOW}$ to the high-level voltage $V_{HIGH}$, the selection signal of the ON voltage $V_{ON}$ output from the selection driver 5 to one of the selection scanning lines $X_1$ to $X_m$ falls.

The low-level voltage $V_{LOW}$ (the reference voltage for the designation current) as the common signal output from the common signal power supply 6 is lower than the reference voltage $V_{SS}$. However, the low-level voltage $V_{LOW}$ may be equal to the reference voltage $V_{SS}$. For this reason, even when the third transistors 23 of the pixels $P_{i,1}$ to $P_{i,n}$ are ON during the selection period $T_{SE}$ of the ith row, a voltage of 0 V or a reverse bias voltage is applied between the anode and the cathode of each of the light-emitting elements $E_{i,1}$ to $E_{i,n}$ because the voltage $V_{LOW}$ of the common signal is lower than the reference voltage $V_{SS}$. Hence, no current flows in the light-emitting elements $E_{i,1}$ to $E_{i,n}$. Light is not emitted. On the other hand, the high-level voltage (the reference voltage for the driving current) $V_{HIGH}$ output from the common signal power supply 6 is set to be higher than the reference voltage $V_{SS}$. That is, when the common signal is the voltage $V_{HIGH}$, the selection scanning driver 5 applies the OFF voltage $V_{OFF}$ to all the selection scanning lines $X_1$ to $X_m$. The transistors 21 and 22 of all the pixels $P_{1,1}$ to $P_{m,n}$ are turned off. A forward bias is applied between the light-emitting elements $E_{1,1}$ to $E_{m,n}$ and the transistors 23 connected in series with the light-emitting elements $E_{1,1}$ to $E_{m,n}$.

Figure 7:
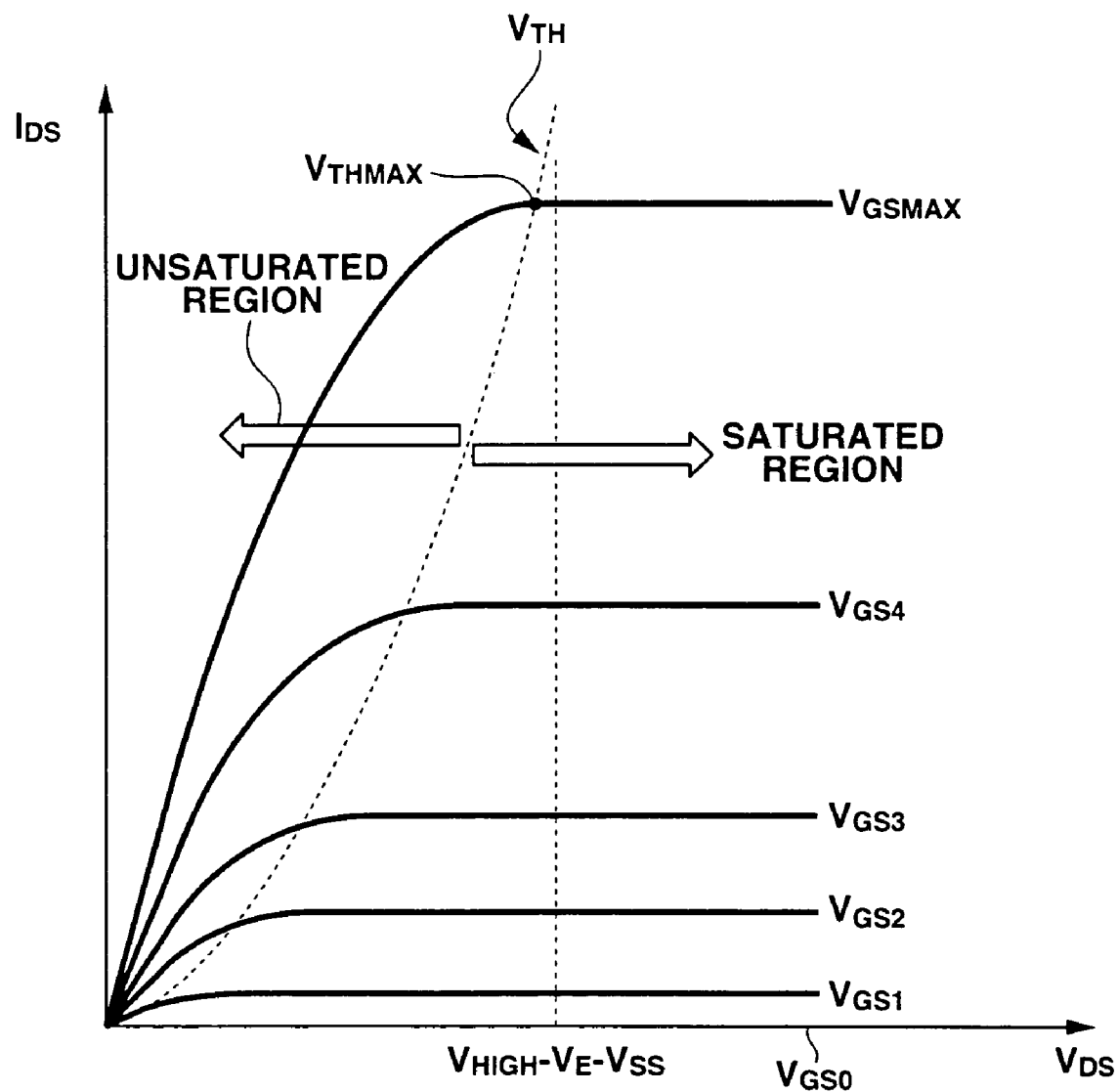
FIG. 7 is a graph showing the current vs. voltage characteristic of an N-channel field effect transistor used in the first embodiment.

The voltage $V_{HIGH}$ will be described. FIG. 7 is a graph showing the current vs. voltage characteristic of the N-channel field effect transistor 23. Referring to FIG. 7, the abscissa represents the voltage value between the drain and the source. The ordinate represents the current value between the drain and the source. In the unsaturated region (the region where source-drain voltage $V_{DS}$<drain saturation threshold voltage $V_{TH}$: the drain saturation threshold voltage $V_{TH}$ is a function of a gate-source voltage $V_{GS}$ and is uniquely defined in accordance with the source-drain voltage $V_{DS}$ when the gate-source voltage $V_{GS}$ is determined) shown in FIG. 7, when the gate-source voltage $V_{GS}$ has a predetermined value, a source-drain current $I_{DS}$ increases as the source-drain voltage $V_{DS}$ increases. In the saturated region (source-drain voltage $V_{DS} \geq$ drain saturation threshold voltage $V_{TH}$) shown in FIG. 7, when the gate-source voltage $V_{GS}$ has a predetermined value, the source-drain current $I_{DS}$ is almost constant even when the source-drain voltage $V_{DS}$ increases.

Referring to FIG. 7, gate-source voltages $V_{GS0}$ to $V_{GSMAX}$ have a relationship given by $V_{GS0}=0$ [V]$<V_{GS1}<V_{GS2}<V_{GS3}<V_{GS4}<V_{GSMAX}$. That is, as is apparent from FIG. 7, when the source-drain voltage $V_{DS}$ has a predetermined value, the source-drain current $I_{DS}$ increases as the gate-source voltage $V_{GS}$ increases independently of whether it is the unsaturated region or saturated region. In addition, as the gate-source voltage $V_{GS}$ increases, the drain saturation threshold voltage $V_{TH}$ increases.

As described above, in the unsaturated region, when the source-drain voltage $V_{DS}$ changes even slightly, the source-drain current $I_{DS}$ changes. In the saturated region, when the gate-source voltage $V_{GS}$ is defined, the source-drain current $I_{DS}$ is uniquely defined independently of the source-drain voltage $V_{DS}$.

When the maximum gate-source voltage $V_{GSMAX}$ is being applied to the third transistor 23, the source-drain current $I_{DS}$ is set to the value of the current that flows between the anode 51 and the cathode of the light-emitting element $E_{i,j}$ that emits light at the maximum luminance.

In addition, to make the third transistor 23 maintain the saturated region even when the gate-source voltage $V_{GS}$ of the third transistor 23 is the maximum voltage $V_{GSMAX}$, the following condition is satisfied.

$$V_{HIGH} - V_E - V_{SS} \geq V_{THMAX}$$

where $V_E$ is the voltage between the anode and the cathode voltage, which is required by the light-emitting element $E_{i,j}$ for emitting light at the maximum luminance during the light emission life period. $V_{THMAX}$ is the saturation threshold voltage between the source and the drain of the third transistor 23, which corresponds to $V_{GSMAX}$. The voltage $V_{HIGH}$ is set such that the above condition is satisfied. Hence, even when the source-drain voltage $V_{DS}$ of the third transistor 23 becomes low due to the voltage division of the light-emitting element $E_{i,j}$ connected in series with the transistor 23, the source-drain voltage $V_{DS}$ always falls within the range of the saturated state. For this reason, the source-drain current $I_{DS}$ that flows to the third transistor 23 is uniquely defined by the gate-source voltage $V_{GS}$.

The data driver 3 will be described next. As shown in FIG. 1, the signal lines $Y_1$ to $Y_n$ are connected to current terminals $CT_1$ to $CT_n$ of the data driver 3, respectively. The data driver 3 receives the control signal group $D_{CNT}$ including the data driver clock signal CK1, start signal ST1, and latch signal L from the controller 11. The data driver 3 also receives the 8-bit red digital gray level image signal $S_R$, green digital gray level image signal $S_G$, and blue digital gray level image signal $S_B$ from an external circuit. The received digital signals are converted into analog signals by the D/A converter in the data driver 3. The data driver 3 controls such that the gray level designation current $I_{DATA}$ based on the latch signal L and the converted analog signals flows from the signal lines $Y_1$ to $Y_n$ to the current terminals $CT_1$ to $CT_n$ of the data driver 3. The gray level designation current $I_{DATA}$ is a current that is equivalent to the current level (current value) that flows to the light-emitting elements $E_{1,1}$ to $E_{m,n}$ to cause them to emit light at a luminance corresponding to a gray level image signal from an external circuit. The gray level designation current $I_{DATA}$ flows from the signal lines $Y_1$ to $Y_n$ to the current terminals $CT_1$ to $CT_n$.

The switching circuit 7 is formed of switching circuits $S_1$ to $S_n$. The switching circuits $S_1$ to $S_n$ are connected to the signal lines $Y_1$ to $Y_n$, respectively. In addition, the current terminals $CT_1$ to $CT_n$ of the data driver 3 are connected to the switching circuits $S_1$ to $S_n$, respectively. Each of the switching circuits $S_1$ to $S_n$ receives the switching signal φ and a reset voltage $V_{RST}$ from the controller 11.

A switching circuit $S_j$ (the switching circuit $S_j$ is connected to the signal line $Y_j$ of the jth column) switches between two operations: an operation in which the gray level designation current $I_{DATA}$ is supplied from the path between the drain 23d and the source 23s of the third transistor 23 and the signal line $Y_j$ to a current terminal $CT_j$ of the data driver 3; and an operation in which the reset voltage $V_{RST}$ having a predetermined voltage level is output from the controller 11 to the signal line $Y_j$. More specifically, when the switching signal φ input from the controller 11 to the switching circuit $S_j$ is at high level, the switching circuit $S_j$ cuts off the current of the current terminal $CT_j$. The switching circuit $S_j$ is also outputs the reset voltage $V_{RST}$ from the controller 11 to the signal line $Y_j$. On the other hand, when the switching signal φ input from the controller 11 to the switching circuit $S_j$ is at low level, the switching circuit $S_j$ supplies the gray level designation current $I_{DATA}$ between the current terminal $CT_j$ and the signal line $Y_j$ to the path between the drain 23d and the source 23s of the transistor 23 and the signal line $Y_j$. The switching circuit $S_j$ also cuts off the reset voltage $V_{RST}$ from the controller 11.

Figure 9A:
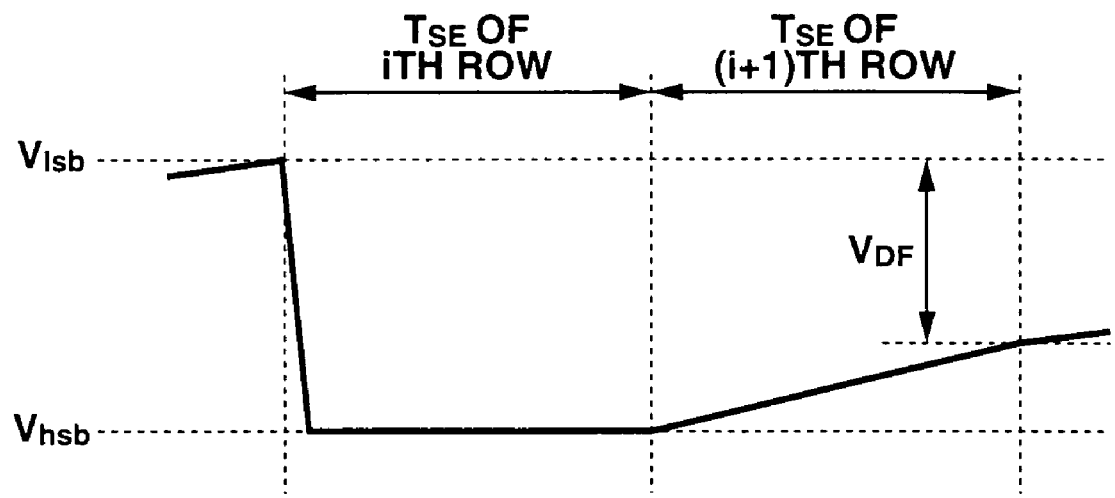
FIG. 9A is a view showing a voltage state when no switching circuit is arranged, and a gray level designation current with the maximum current value is supplied across the drain and source of a transistor and a signal line during the selection period of the ith row.

In the organic EL display 1 having no switching circuit 7 for reset, assume that, e.g., the pixel $P_{i,j}$ of the ith row on the signal line $Y_j$ of the jth column should emit light at the highest gray level, as shown in FIG. 9A. Assume that, for this purpose, the gray level designation current $I_{DATA}$ having the maximum current value is supplied to the path between the drain 23d and the source 23s of the third transistor 23 and the signal line $Y_j$ during the selection period $T_{SE}$. At this time, a highest gray level voltage Vhsb of the current terminal $CT_j$ is much lower than the voltage $V_{LOW}$ and reference voltage $V_{SS}$ of the common signal power supply 6. That is, the potential difference between the current terminal $CT_j$ and the voltage $V_{LOW}$ of the common signal power supply 6 is sufficiently large. For this reason, a large current can rapidly be supplied to the path between the drain 23d and the source 23s of the transistor 23 and the signal line $Y_j$ to charge up the parasitic capacitance of the signal line $Y_j$, and a steady state can quickly be set. Next, assume that the pixel $P_{i+1,j}$ of the (i+1)th row should emit light at the lowest gray level luminance. Assume that, for this purpose, the gray level designation current $I_{DATA}$ having the minimum current value (the current value is not zero) is to be supplied to the signal line $Y_j$. That is assume that the potential of the current terminal $CT_j$ is to be changed to a lowest gray level voltage Vlsb which has a small potential difference to the voltage $V_{LOW}$ of the common signal power supply 6 by supplying the very small gray level designation current $I_{DATA}$, and the gray level designation current $I_{DATA}$ should thus be set in the steady state. At this time, the amount of charges which are stored in the parasitic capacitance of the signal line $Y_j$ when the gray level designation current $I_{DATA}$ for the ith row is supplied is large. For this reason, the potential difference that corresponds to the change in potential of the signal line $Y_j$ per unit time becomes small. A long time may therefore be required until the potential of the signal line $Y_j$ is changed from the highest gray level voltage Vhsb to the lowest gray level voltage Vlsb and set in the steady state. In addition, when the selection period $T_{SE}$ is set to be short, a difference corresponding to a voltage $V_{DF}$ is generated before the potential reaches the lowest gray level voltage Vlsb. Hence, the pixel $P_{i+1,j}$ cannot emit light at an accurate luminance.

Figure 9B:
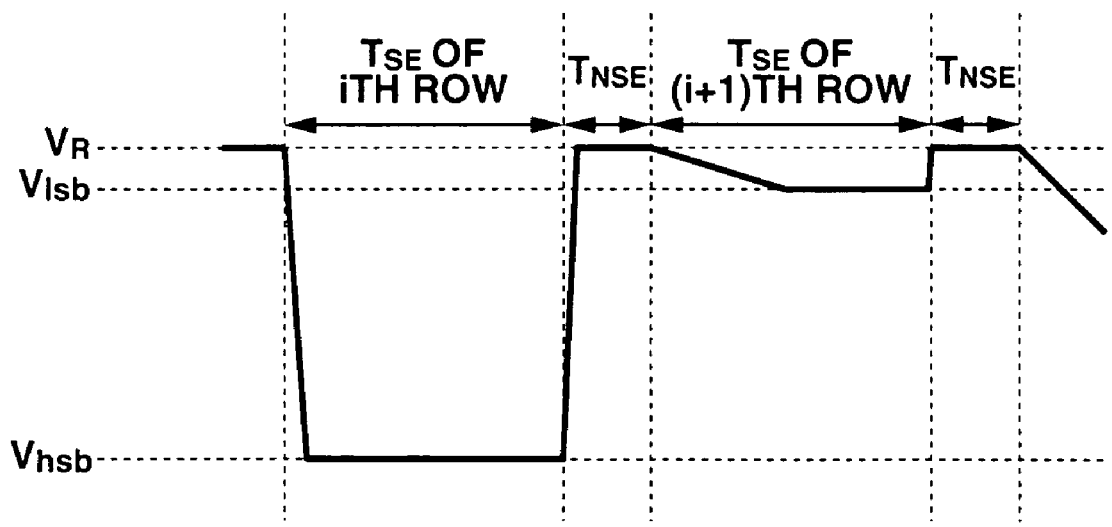
FIG. 9B is a view showing a voltage state when a switching circuit is arranged, and a gray level designation current with the maximum current value is supplied across the drain and source of a transistor and a signal line during the selection period of the ith row.

The organic EL display 1 of this embodiment has the switching circuit 7. Hence, as shown in FIG. 9B, the switching circuit $S_j$ forcibly switches the potential of the signal line $Y_j$ to the reset voltage $V_{RST}$ much higher than the highest gray level voltage Vhsb during the non-selection period $T_{NSE}$, i.e., before the gray level designation current $I_{DATA}$ for the (i+1)th row is supplied to the path between the drain 23d and the source 23s of the transistor 23 and the signal line $Y_j$. During the selection period $T_{SE}$, the amount of charges stored in the signal line $Y_j$ serving as a parasitic capacitance quickly changes so the signal line $Y_j$ can rapidly be set at a high potential. For this reason, even when the gray level designation current $I_{DATA}$ for the (i+1)th row has a very small current value corresponding to the lowest gray level, the potential can quickly reach the lowest gray level voltage Vlsb.

The reset voltage $V_{RST}$ is set to be higher than the highest gray level voltage Vhsb. The highest gray level voltage Vhsb is set in the steady state in accordance with charges stored in the signal lines $Y_1$ to $Y_n$ by the gray level designation current $I_{DATA}$ which has a current value equal to a maximum gray level driving current $I_{MAX}$. The maximum gray level driving current $I_{MAX}$ flows to the light-emitting elements $E_{1,1}$ to $E_{m,n}$ when they emit light at a maximum gray level luminance $L_{MAX}$ for brightest light during the selection period $T_{SE}$. More preferably, the reset voltage $V_{RST}$ is set to be equal to or higher than an intermediate voltage that has an intermediate value between the lowest gray level voltage Vlsb and the highest gray level voltage Vhsb. The lowest gray level voltage Vlsb is set in the steady state in accordance with charges stored in the signal lines $Y_1$ to $Y_n$ by the gray level designation current $I_{DATA}$ which has a current value equal to a minimum gray level driving current $I_{MIN}$. The minimum gray level driving current $I_{MIN}$ flows to the light-emitting elements $E_{1,1}$ to $E_{m,n}$ when they have a minimum gray level luminance $L_{MIN}$ (however, the current level is more than 0 A) for darkest light. The reset voltage $V_{RST}$ more preferably has a value equal to or more than the lowest gray level voltage Vlsb.

An example of the switching circuit $S_j$ of the jth column will be described. The switching circuit $S_j$ is constituted by a fourth transistor 31 formed of a P-channel field effect transistor and a fifth transistor 32 formed of an N-channel field effect transistor. The gate electrode of the transistor 31 and the gate electrode of the transistor 32 are connected to the controller 11 so that the switching circuit $S_j$ receives the switching signal φ. The source electrode of the transistor 31 is connected to the signal line $Y_j$. The drain electrode of the transistor 31 is connected to the current terminal $CT_j$ of the data driver 3. The drain electrode of the transistor 32 is connected to the signal line $Y_j$. The source electrode of the transistor 32 is connected to the controller 11 so that the switching circuit $S_j$ receives the reset voltage $V_{RST}$. In this arrangement, when the switching signal φ from the controller 11 is at high level, the fifth transistor 32 is turned on while the fourth transistor 31 is turned off. On the other hand, when the switching signal φ from the controller 11 is at low level, the transistor 31 is turned on while the transistor 32 is turned off. The transistor 31 may be set to a P-channel type, and the transistor 32 may be set to an N-channel type. In this case, the switching mode of the switching circuit $S_j$ is changed by reversing the phase of the switching signal φ.

The period of the switching signal φ input to the controller 11 will be described here. As shown in FIG. 8, when the selection scanning driver 5 is applying the ON voltage $V_{ON}$ to one of the selection scanning lines $X_1$ to $X_m$, the switching signal φ input to the controller 11 is at low level. On the other hand, during the non-selection period $T_{NSE}$ when the selection scanning driver 5 is applying the OFF voltage $V_{OFF}$ to all the selection scanning lines $X_1$ to $X_m$, the switching signal φ input to the controller 11 is at high level. That is, the switching signal φ input to the controller 11 is a pulse signal which changes to high level for each of the m non-selection periods $T_{NSE}$ in one selection period $T_{SE}$.

The switching circuits $S_1$ to $S_n$ are circuits which switch between two operations: an operation for supplying the gray level designation current $I_{DATA}$ from the signal lines $Y_1$ to $Y_n$ to the current terminals $CT_1$ to $CT_n$ in accordance with the switching signal φ from the controller 11; and an operation for forcibly charging the signal lines $Y_1$ to $Y_n$ to the reset voltage $V_{RST}$. When the switching signal φ input from the controller 11 is at low level, i.e., during the selection period $T_{SE}$ of one of the selection scanning lines $X_1$ to $X_m$, each switching circuit turns on the transistor 31 and off the transistor 32. With this operation, the gray level designation current $I_{DATA}$ flows to the current terminals $CT_1$ to $CT_n$ through the paths between the drain 23d and the source 23s of the transistors 23 and the signal lines $Y_1$ to $Y_n$. When the switching signal φ input from the controller 11 is at high level, i.e., during the non-selection period $T_{NSE}$ of all the selection scanning lines $X_1$ to $X_m$, each switching circuit turns off the transistor 31 and on the transistor 32. At this time, the gray level designation current $I_{DATA}$ does not flow to the drains 23d and sources 23s of the transistors 23 and the signal lines $Y_1$ to $Y_n$. Instead, the potentials of the signal lines $Y_1$ to $Y_n$ are forcibly set to the reset voltage $V_{RST}$.

Hence, in the selection period $T_{SE}$ of each row, the gray level designation current $I_{DATA}$ flows from the signal lines $Y_1$ to $Y_n$ to the current terminals $CT_1$ to $CT_n$. On the other hand, in the non-selection period $T_{NSE}$ between the rows, the reset voltage $V_{RST}$ is forcibly applied to the signal lines $Y_1$ to $Y_n$. The charge amount of the parasitic capacitance of the signal lines $Y_1$ to $Y_n$ becomes almost the same as the charge amount when the small gray level designation current $I_{DATA}$ flows, and the steady state is set. For this reason, even when the current value of the gray level designation current $I_{DATA}$ is very small, the steady state can quickly be set.

In the selection period $T_{SE}$ of each row, the data driver 3 generates the gray level designation current $I_{DATA}$ which should flow from the common signal supply lines $Z_1$ to $Z_m$ to the current terminals $CT_1$ to $CT_n$ through the transistors 23, transistors 21, signal lines $Y_1$ to $Y_n$, and switching circuits $S_1$ to $S_n$. The current value of the gray level designation current $I_{DATA}$ is equal to the current value of the driving current which is supplied to the light-emitting elements $E_{1,1}$ to $E_{m,n}$ to cause them to emit light at a luminance gray level corresponding to image data.

A method of causing the data driver 3, selection scanning driver 5, and common signal power supply 6 to drive the organic EL display panel 2 and the display operation of the organic EL display 1 will be described next.

As shown in FIG. 8, on the basis of the selection scanning driver clock signal CK2 received from the controller 11, the selection scanning driver 5 sequentially applies the ON voltage $V_{ON}$ to the selection scanning line $X_1$ of the first row to the selection scanning line $X_m$ of the mth row in this order (the selection scanning line $X_1$ follows the selection scanning line $X_m$) during each selection period $T_{SE}$ to select the selection scanning line. Accordingly, the selection scanning lines $X_1$ to $X_m$ are scanned in this order.

Simultaneously when the selection scanning driver 5 sequentially selects and scans the selection scanning lines, the common signal power supply 6 outputs common signals to all the common signal supply lines $Z_1$ to $Z_m$. The common signals output to the common signal supply lines $Z_1$ to $Z_m$ are synchronized with each other. In all pixel circuits $D_{1,1}$ to $D_{m,n}$, the common signal of the voltage $V_{LOW}$ is input to the source electrode 22s of the second transistor 22 and the source electrode 23s of the third transistor 23.

In addition, during the sequential scanning by the selection scanning driver, the data driver 3 receives and latches the 8-bit red digital gray level image signal $S_R$, green digital gray level image signal $S_G$, and blue digital gray level image signal $S_B$ from an external circuit on the basis of the data driver clock signal CK1 input from the controller 11. When the selection signal $V_{ON}$ that selects the selection scanning line $X_i$ is output, the switching signal φ is synchronously input to the switching circuit 7. The switching signal φ turns on the transistor 31 and off the transistor 32. The gray level designation currents $I_{DATA}$ having current values based on the gray level of the latched signals flow to the current terminals $CT_1$ to $CT_n$ of the data driver 3 through the common signal supply line $Z_i$, the paths between the drains 23d and the sources 23s of the transistors 23 of the pixels $P_{i,1}$ to $P_{i,n}$, the paths between the drains 21d and the sources 21s of the transistors 21 of the pixels $P_{i,1}$ to $P_{i,n}$, and the signal lines $Y_1$ to $Y_n$.

When the selection signal of ON level $V_{ON}$ is being output to the given selection scanning line $X_i$, a selection signal of off level is output to the remaining selection scanning lines $X_1$ to $X_m$ (except $X_i$). This period is the selection period $T_{SE}$ of the ith row. Hence, for the pixel circuits $D_{i,1}$ to $D_{i,n}$ of the ith row, the first transistor 21 and second transistor 22 are ON. For the pixel circuits $D_{1,1}$ to $D_{m,n}$ (except the pixel circuits $D_{i,1}$ to $D_{i,n}$) of the remaining rows, the first transistor 21 and second transistor 22 are OFF.

That is, when the voltage $V_{ON}$ is applied to the selection scanning line $X_i$ during the selection period $T_{SE}$ of the ith row, the first transistors 21 and second transistors 22 in the pixel circuits $D_{i,1}$ to $D_{i,n}$ are turned on. At this time, the voltage $V_{LOW}$ from the common signal supply lines $Z_1$ to $Z_m$ is supplied to the drain electrodes 23d of the third transistors 23 and the drain electrodes 22d of the second transistors 22 of all the pixel circuits $D_{1,1}$ to $D_{m,n}$. Simultaneously, the data driver 3 is going to supply the gray level designation current $I_{DATA}$ to the current terminals $CT_1$ to $CT_n$ in accordance with the latch signal L. At this time, the switching signal φ is input from the controller 11 to the switching circuit 7 to turn on the transistors 31 and off the transistors 32. Hence, the current terminals $CT_1$ to $CT_n$ are electrically connected to the common signal supply line $Z_i$. The voltage $V_{LOW}$ of the common signal supply line $Z_i$ is set to be higher than the potentials of the current terminals $CT_1$ to $CT_n$. For this reason, a voltage that supplies the gray level designation current $I_{DATA}$ to the path between the source and the drain of the third transistor 23 is applied between the gate 23g and the source 23s and between the source 23s and the drain 23d of the third transistor 23.

The current value of the gray level designation current $I_{DATA}$ is based on the red digital gray level image signal $S_R$, green digital gray level image signal $S_G$, and blue digital gray level image signal $S_B$ input to the data driver 3. During the selection period $T_{SE}$, the data driver 3 stores charges in the capacitor 24 between the gate 23g and the source 23s of the transistor 23 of each of the pixel $P_{i,1}$ to $P_{i,n}$. With this operation, the current value of the gray level designation current $I_{DATA}$ that flows to the current terminals $CT_1$ to $CT_n$ of the data driver 3 through the common signal supply line $Z_i$, the paths between the drains 23d and the sources 23s of the transistors 23 of the pixels $P_{i,1}$ to $P_{i,n}$, the paths between the drains 21d and the sources 21s of the transistors 21 of the pixels $P_{i,1}$ to $P_{i,n}$, and the signal lines $Y_1$ to $Y_n$ is set in the stead state. That is, the gray level designation current $I_{DATA}$ having a predetermined current value is supplied to the paths between the drains 23d and the sources 23s of the transistors 23 of the pixels $P_{i,1}$ to $P_{i,n}$. After that, the capacitor 24 can hold the charges at least during one scanning period $T_{SC}$ or more. In other words, the transistor 23 is going to supply a driving current having a current value equal to the gray level designation current $I_{DATA}$ at least for a time corresponding to one scanning period $T_{SC}$ or more by the charges in the capacitor 24. That is, the capacitor 24 serves as a storage means for storing the current value of the gray level designation current $I_{DATA}$ that flows during the selection period $T_{SE}$ and flowing a driving current having a current value equal to the gray level designation current $I_{DATA}$ to the light-emitting elements $E_{i,1}$ to $E_{i,n}$ during the non-selection period $T_{NSE}$.

Hence, during the selection period $T_{SE}$ of the ith row, the first transistors 21 and second transistors 22 of the pixel circuits $D_{i,1}$ to $D_{i,n}$ of the ith row are turned on. Accordingly, the gray level designation current $I_{DATA}$ supplied from the signal lines $Y_1$ to $Y_n$ to the data driver 3 is stored in the capacitor 24 of each of the pixel circuits $D_{i,1}$ to $D_{i,n}$ of the ith row. In each of the pixel circuits $D_{1,1}$ to $D_{m,n}$ (except the pixel circuits $D_{i,1}$ to $D_{i,n}$) of the remaining rows, the first transistor 21 and second transistor 22 are OFF. Hence, the gray level designation current $I_{DATA}$ is not stored in the capacitors 24 of the remaining rows. That is, the third transistors 23 of the remaining rows cannot flow the gray level designation current $I_{DATA}$. As described above, during the selection period $T_{SE}$ of the ith row, charges between the gate and the source of the third transistor 23 are received by each of the pixel circuits $D_{i,1}$ to $D_{i,n}$ in correspondence with the gray level designation current $I_{DATA}$. Accordingly, the charges between the gate and the source of the third transistor 23, which have been stored so far, are refreshed. During the plurality of non-selection periods $T_{NSE}$ after the selection period $T_{SE}$ of the ith row, the pixel circuits $D_{i,1}$ to $D_{i,n}$ supply driving currents (the driving currents have the same level as that of the gray level designation current $I_{DATA}$) corresponding to the charges stored between the gates and the sources of the third transistors 23 to the light-emitting elements $E_{i,1}$ to $E_{i,n}$, thereby causing them to emit light.

As described above, the selection scanning driver 5 line-sequentially shifts the selection signal from the first row to the mth row. Accordingly, the gray level designation current $I_{DATA}$ flows sequentially to the pixel circuits $D_{1,1}$ to $D_{1,n}$ of the first row to the pixel circuits $D_{m,1}$ to $D_{m,n}$ of the mth row in accordance with the red digital gray level image signal $S_R$, green digital gray level image signal $S_G$, and blue digital gray level image signal $S_B$ input to the data driver 3. With this operation, the charges stored between the gate and the source of each third transistor 23 are refreshed. When such line-sequential scanning is repeated, an image is displayed on the display section 4 of the organic EL display panel 2.

The operation of causing the pixel circuits $D_{i,1}$ to $D_{i,n}$ to receive the gray level designation current $I_{DATA}$ during the selection period $T_{SE}$ of the ith row and the operation of causing the light-emitting elements $E_{i,1}$ to $E_{i,n}$ to emit light on the basis of the received gray level designation current $I_{DATA}$ will be described here in detail.

During the selection period $T_{SE}$ of the ith row, a selection signal of the ON voltage $V_{ON}$ is output from the selection scanning driver 5 to the selection scanning line $X_i$ of the ith row in accordance with the control signal group $G_{CNT}$ including the clock signal CK2 from the controller 11. Then, the first transistors 21 and second transistors 22 of all the pixel circuits $D_{i,1}$ to $D_{i,n}$ connected to the selection scanning line $X_i$ are set in the ON state during the selection period $T_{SE}$. At the start of the selection period $T_{SE}$ of the ith row, the common signal changes to the voltage $V_{LOW}$. During the selection period $T_{SE}$ of the ith row, the voltage $V_{LOW}$ is applied to all the common signal supply lines $Z_1$ to $Z_m$. Since the second transistor 22 is ON, a voltage is applied even to the gate electrode 23g of the third transistor 23. Hence, the third transistor 23 is turned on.

Furthermore, when a given column of the light-emitting elements $E_{i,1}$ to $E_{i,n}$ of the selected row is to be caused to emit light during the non-selection period $T_{NSE}$ (to be described later), the data driver 3 controls the potential of one of the current terminals $CT_1$ to $CT_n$, which corresponds to the column to be caused to emit light, to be lower than the voltage $V_{LOW}$. Accordingly, in the column of the pixel circuit $D_{i,j}$, which should emit light, the gray level designation current $I_{DATA}$ flows from the common signal supply line $Z_i$ to the data driver 3. When a given column of the light-emitting elements $E_{i,1}$ to $E_{i,n}$ of the selected ith row is to be inhibited from emitting light during the non-selection period $T_{NSE}$ (to be described later), the data driver 3 controls the potential of one of the current terminals $CT_1$ to $CT_n$, which corresponds to the column that should be inhibited from emitting light, to be equal to the voltage $V_{LOW}$. Accordingly, in the column of the pixel circuit $D_{i,j}$, which should emit light, the gray level designation current $I_{DATA}$ does not flow from the common signal supply line $Z_i$ to the data driver 3. During the selection period $T_{SE}$ of the ith row, the data driver 3 controls the potentials of the current terminals $CT_1$ to $CT_n$ to supply the gray level designation current $I_{DATA}$ to the data driver 3 to the signal lines $Y_1$ to $Y_n$ (the gray level designation current $I_{DATA}$ does not flow for a column which should be inhibited from emitting light). In each of the pixel circuits $D_{i,1}$ to $D_{i,n}$ of the ith row, the first transistor 21 and second transistor 22 are turned on. Hence, the gray level designation current $I_{DATA}$ flows through a path of common signal supply line $Z_i \rightarrow$ paths between the drains 23d and the sources 23s of the transistors 23 of the pixels $P_{i,1}$ to $P_{i,n} \rightarrow$ paths between the drains 21d and the sources 21s of the transistors 21 of the pixels $P_{i,1}$ to $P_{i,n} \rightarrow$ signal lines $Y_1$ to $Y_n \rightarrow$ transistors 31 of the switching circuits $S_1$ to $S_n \rightarrow$ current terminals $CT_1$ to $CT_n$ of the data driver 3.

As described above, charges corresponding to the current value of the gray level designation current $I_{DATA}$ are received by the pixel circuits $D_{i,1}$ to $D_{i,n}$. At this time, in all of the first to nth columns, the current value of the driving current flowing to the light-emitting elements $E_{i,1}$ to $E_{i,n}$ is equal to the current value of the gray level designation current $I_{DATA}$. The current value is designated by the data driver 3. Hence, the current value of the gray level designation current $I_{DATA}$ which is continuously held during the non-selection period $T_{NSE}$ is constant.

That is, during the selection period $T_{SE}$, the gray level designation current $I_{DATA}$ flows to the third transistor 23. The voltage across the common signal supply line $Z_i$, third transistors 23, first transistors 21, signal lines $Y_1$ to $Y_n$, switching circuits $S_1$ to $S_n$, and data driver 3 is set in the steady state. Accordingly, a voltage at a level corresponding to the level of the gray level designation current $I_{DATA}$ that flows to the third transistor 23 is applied between the gate electrode 23g and the source electrode 23s of the third transistor 23. Charges with a magnitude corresponding to the level of the voltage between the gate electrode 23g and the source electrode 23s of the third transistor 23 are stored in the capacitor 24. During the selection period $T_{SE}$ of the ith row, in each of the pixel circuits $D_{i,1}$ to $D_{i,n}$ of the ith row, the first transistor 21 and second transistor 22 function to supply the gray level designation current $I_{DATA}$ flowing to the signal line $Y_j$ to the third transistor 23. The third transistor 23 functions to convert the current value of the gray level designation current $I_{DATA}$ into the value of the voltage between the gate and the source.

As described above, during the selection period $T_{SE}$ of the ith row, the magnitude of the charges stored in the capacitors 24 of the pixel circuits $D_{i,1}$ to $D_{i,n}$ of the ith row is refreshed from the preceding scanning period $T_{SC}$. At the same time, the drain-source current level and the source-drain voltage level of the third transistors 23 of the pixel circuits $D_{i,1}$ to $D_{i,n}$ of the ith row are also refreshed from the preceding scanning period $T_{SC}$.

The potential at an arbitrary point on the path of the third transistor 23, first transistor 21, and signal line $Y_j$ changes depending on the internal resistance of the transistors 21, 22, and 23, which changes over time. However, in this embodiment, the current value of the gray level designation current $I_{DATA}$ that flows through the path of third transistor 23 → first transistor 21 → signal line $Y_j$ is forcibly supplied by the data driver 3. Hence, even when the internal resistance of the transistors 21, 22, and 23 changes over time, the gray level designation current $I_{DATA}$ that flows through the path of third transistor 23 → first transistor 21 → signal line $Y_j$ has a desired level.

During the selection period $T_{SE}$ of the ith row, the common signal supply line $Z_i$ is set to the voltage $V_{LOW}$ that is equal to or lower than the reference voltage $V_{SS}$. In addition, a zero bias or reverse bias is applied across the anodes and the cathodes of the light-emitting elements $E_{i,1}$ to $E_{i,n}$ of the ith row. Hence, no current flows to the light-emitting elements $E_{i,1}$ to $E_{i,n}$, and they does not emit light.

At the end time of the selection period $T_{SE}$ of the ith row (at the start time of the non-selection period $T_{NSE}$ Of the ith row), the selection signal output from the selection scanning driver 5 to the selection scanning line $X_i$ changes from the high-level potential $V_{ON}$ to the low-level potential $V_{OFF}$. The selection scanning driver 5 applies the OFF voltage $V_{OFF}$ to the gate electrodes 21g of the first transistors 21 and the gate electrodes 22g of the second transistors 22 of the pixel circuits $D_{i,1}$ to $D_{i,n}$ of the ith row.

Hence, during the non-selection period $T_{NSE}$ of the ith row, the first transistors 21 of the pixel circuits $D_{i,1}$ to $D_{i,n}$ of the ith row are turned off. The gray level designation current $I_{DATA}$ that flows from the common signal supply line $Z_i$ to the corresponding signal lines $Y_1$ to $Y_n$ is cut off. In addition, during the non-selection period $T_{NSE}$ of the ith row, in all the pixel circuits $D_{i,1}$ to $D_{i,n}$ of the ith row, even when the transistor 22 is turned off, charges stored in the capacitor 24 during the immediately preceding selection period $T_{SE}$ of the ith row are confined by the second transistor 22. For this reason, in all the pixel circuits $D_{i,1}$ to $D_{i,n}$ of the ith row, the third transistor 23 is kept ON during the non-selection period $T_{NSE}$. That is, in all the pixel circuits $D_{i,1}$ to $D_{i,n}$ of the ith row, the second transistor 22 holds the gate-source voltage level $V_{GS}$ of the third transistor 23 such that the gate-source voltage level $V_{GS}$ of the third transistor 23 during the non-selection period $T_{NSE}$ becomes equal to the gate-source voltage level $V_{GS}$ of the third transistor 23 during the selection period $T_{SE}$.

During the non-selection period $T_{NSE}$, the common signal output from the common signal power supply 6 to the common signal supply line $Z_i$ rises to the voltage $V_{HIGH}$. During the non-selection period $T_{NSE}$, the cathodes of the light-emitting elements $E_{i,1}$ to $E_{i,n}$ of the ith row are at the reference voltage $V_{SS}$. The common signal supply line $Z_i$ is at the voltage $V_{HIGH}$ higher than the reference voltage $V_{SS}$. In addition, charges corresponding to the gray level designation current $I_{DATA}$ flowing during the selection period $T_{SE}$ are stored between the gate 23g and the source 23s of the third transistor 23 connected in series. In this case, a forward bias voltage corresponding to the gray level designation current $I_{DATA}$ is applied to the light-emitting elements $E_{i,1}$ to $E_{i,n}$ of the ith row. Hence, in all the pixel circuits $D_{i,1}$ to $D_{i,n}$ of the ith row, a driving current equal to the gray level designation current $I_{DATA}$ flows from the common signal supply line $Z_i$ to the light-emitting elements $E_{i,1}$ to $E_{i,n}$ of the ith row through the drains 23s and sources 23s of the third transistors 23. Hence, the light-emitting elements $E_{i,1}$ to $E_{i,n}$ emit light.

More specifically, in each of the pixel circuits $D_{i,1}$ to $D_{i,n}$ during the non-selection period $T_{NSE}$, the first transistor 21 functions to electrically disconnect the corresponding signal line $Y_j$ from the third transistor 23 such that the gray level designation current $I_{DATA}$ flowing to the signal line $Y_j$ does not flow to the third transistor 23. The second transistor 22 functions to hold the voltage between the gate 23g and the source 23s of the third transistor 23, which is converted during the selection period $T_{SE}$, by confining the charges in the capacitor 24. In all the pixel circuits $D_{i,1}$ to $D_{i,n}$ of the ith row, when the common signal is set to the voltage $V_{HIGH}$ during the non-selection period $T_{NSE}$, the third transistor 23 functions to supply a driving current of a level corresponding to the held gate-source voltage level to the light-emitting element $E_{i,j}$.

Hence, the light-emitting elements $E_{i,1}$ to $E_{i,n}$ of the ith row do not emit light during each of the selection periods $T_{SE}$ of the first to mth rows. The light-emitting elements $E_{i,1}$ to $E_{i,n}$ emit light during each of the m non-selection periods $T_{NSE}$ in one scanning period $T_{SC}$. The current value of the driving current that flows to the light-emitting elements $E_{i,1}$ to $E_{i,n}$ when the common signal is at $V_{HIGH}$ is the same as that of the current flowing to the third transistor 23 of each of the pixel circuits $D_{i,1}$ to $D_{i,n}$. That is, the current value is equal to that of the gray level designation current $I_{DATA}$ that flows to the third transistor 23 of each of the pixel circuits $D_{i,1}$ to $D_{i,n}$ during the selection period $T_{SE}$ of the ith row. During the selection period $T_{SE}$ of the ith row, when the current value that flows to the third transistor 23 of each of the pixel circuits $D_{i,1}$ to $D_{i,n}$ of the ith row is set, the driving current of each of the light-emitting elements $E_{i,1}$ to $E_{i,n}$ has a desired current value. Hence, the light-emitting elements $E_{i,1}$ to $E_{i,n}$ emit light at a desired gray level luminance.

As described above, in this embodiment, even when the current vs. voltage characteristic of the third transistor 23 changes between the pixel circuits $D_{1,1}$ to $D_{m,n}$, the gray level designation current $I_{DATA}$ having a predetermined current value is forcibly supplied between the source 23s and the drain 23d of the third transistor 23 during the selection period $T_{SE}$. In addition, when the voltage between the source 23s and the drain 23d of the third transistor 23 is always saturated, as shown in FIG. 7, the common signal of the voltage $V_{HIGH}$ is output to the common signal supply lines $Z_1$ to $Z_m$ during the non-selection period $T_{NSE}$. Accordingly, a driving current having a current value equal to the gray level designation current $I_{DATA}$ is supplied between the source 23s and the drain 23d of the third transistor 23. For this reason, the luminance does not vary between the light-emitting elements $E_{1,1}$ to $E_{m,n}$ of the pixels. That is, in this embodiment, even when a luminance gray level signal having the same voltage level is output to pixels, any in-plane variation in luminance between the pixels can be suppressed. Hence, the organic EL display 1 of this embodiment can display a high-quality image.

During the non-selection period $T_{NSE}$, the common signal changes to $V_{HIGH}$ m times. The light emission duty of the light-emitting element $E_{i,j}$ is about 50%. To the contrary, in a simple matrix driving display having m light-emitting elements arrayed in the vertical direction and n light-emitting elements arrayed in the horizontal direction, the light emission duty is 1/m. In the simple matrix driving display, as the resolution becomes high, the light emission duty of the light-emitting element decreases. In the organic EL display 1 of this embodiment, however, even when the resolution becomes high, the light emission duty of the light-emitting element $E_{i,j}$ does not decrease. The organic EL display 1 can display an image at a high luminance, high contrast, and high resolution.

One selection scanning line $X_i$ and one common signal supply line $Z_i$ are arranged in each row. Not a signal for scanning but a common signal is simply output from the common signal power supply 6 to the common signal supply line $Z_i$. The only shift register for scanning, which is arranged in the organic EL display 1, is the selection scanning driver 5. A shift register is generally formed from m flip-flop circuits. The common signal power supply 6 only needs to output signals having the same waveform to all the common signal supply lines $Z_1$ to $Z_m$ and therefore can have a simplified circuit structure. For this reason, in the common signal power supply 6, the mounting area is smaller, the structure is simpler, and the number of elements is smaller than a shift register. As compared to a conventional organic EL display having two shift registers serving as drivers, the organic EL display 1 of this embodiment can reduce the manufacturing cost and increase the yield.

SECOND EMBODIMENT

An organic EL display according to the second embodiment will be described next.

Even in the second embodiment, the organic EL display comprises an organic EL display panel 2, data driver 3, and selection scanning driver 5, like the organic EL display 1 according to the first embodiment shown in FIG. 1. The data driver 3, a display section 4, the selection scanning driver 5, pixel circuits $D_{1,1}$ to $D_{m,n}$, and light-emitting elements $E_{1,1}$ to $E_{m,n}$ have the same structures as those in the organic EL display 1 of the first embodiment, and a detailed description thereof will be omitted in the second embodiment.

Figure 10:
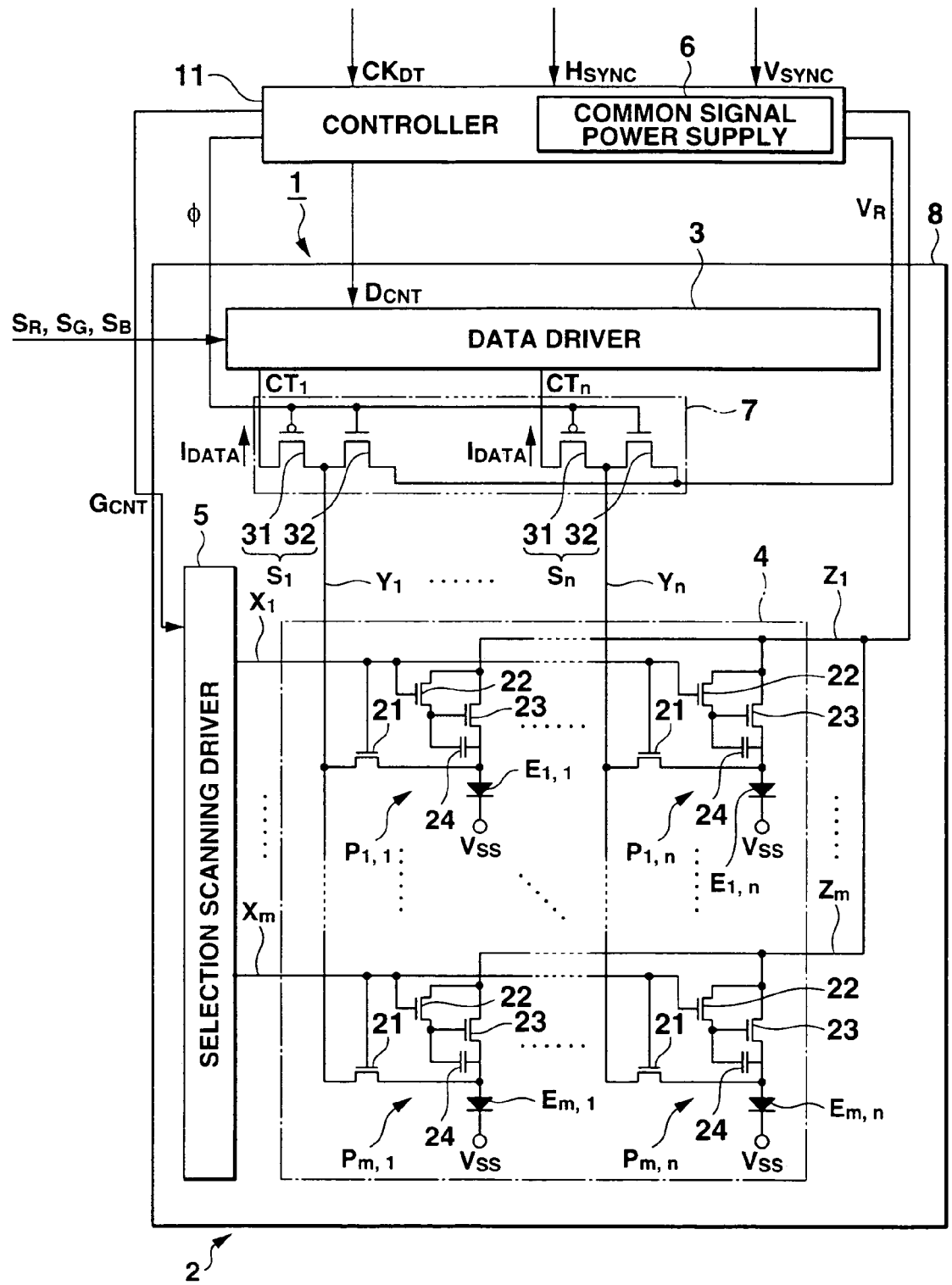
FIG. 10 is a view showing an organic EL display applied as a display device according to the second embodiment of the present invention, in which a common signal power supply is arranged in a controller.

In the second embodiment, a common signal power supply 6 is arranged in a controller 11 connected to the organic EL display 1, as shown in FIG. 10. For this reason, the ratio of the occupied area of the pixels on the substrate of the organic EL display 1 can be increased.

The organic EL display 1 according to the second embodiment can operate in accordance with the waveform chart shown in FIG. 8, as in the first embodiment.

THIRD EMBODIMENT

Figure 11:
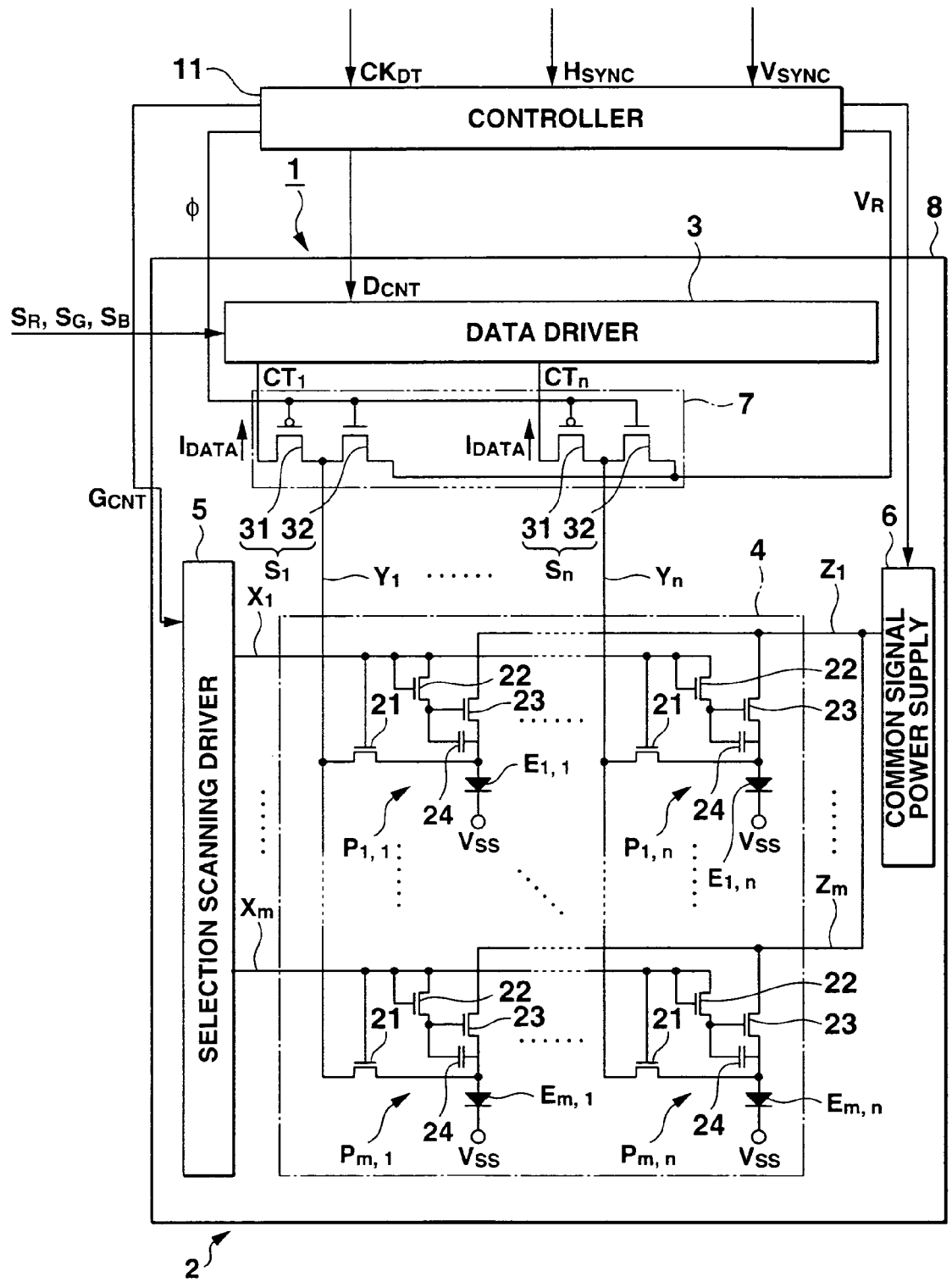
FIG. 11 is a view showing an organic EL display applied as a display device according to the third embodiment of the present invention, in which the drain of the transistor of a pixel circuit is connected to a selection scanning line.

The third embodiment will be described next. This embodiment is the same as the first embodiment except that a drain 22d of a second transistor 22 of a pixel circuit $D_{i,j}$ of each pixel $P_{i,j}$ is not connected to a common signal supply line $Z_i$ but to a selection scanning line $X_i$, as shown in FIG. 11. The same reference numerals as in the first embodiment denote the same parts in the third embodiment, and a detailed description thereof will be omitted.

In the transistor 22, the drain electrode 22d and gate electrode 22g are connected to the selection scanning line $X_i$. A source electrode 22s is connected to a gate electrode 23g of a third transistor 23. The transistor 22 is an N-channel amorphous silicon thin film transistor, like a first transistor 21 and the transistor 23.

Figure 12A:
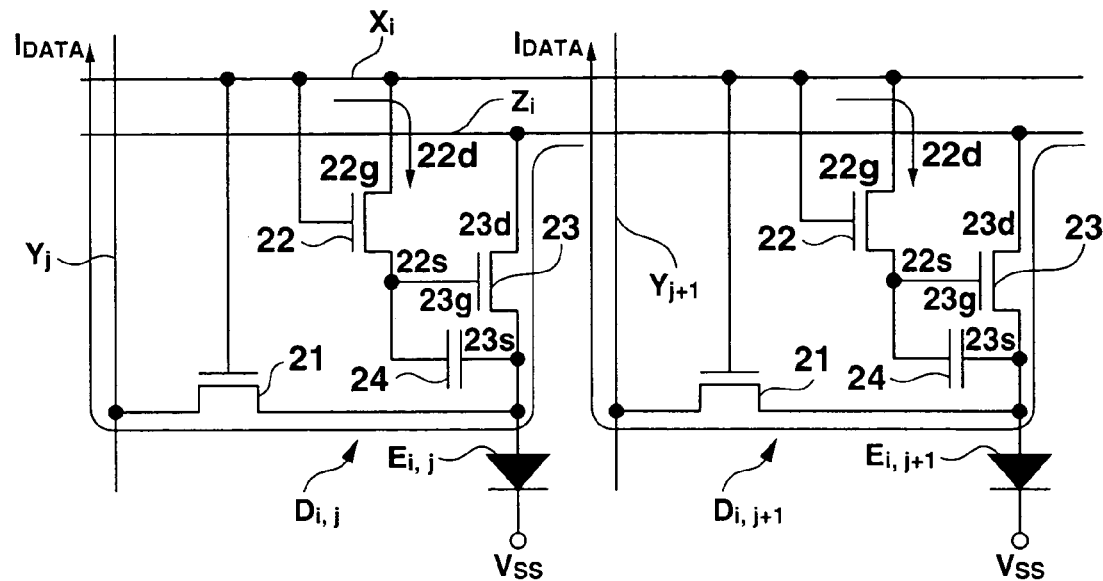
FIGS. 12A and 12B are equivalent circuit diagrams showing adjacent pixels in the third embodiment to indicate current flows in different operation periods.

The transistor 22 operates upon receiving the voltage shown in the waveform chart in FIG. 8. That is, as shown in FIG. 12A, during a selection period $T_{SE}$, the transistor 22 of each of pixels $P_{i,1}$ to $P_{i,n}$ is turned on by a scanning signal of an ON-level (high-level) voltage $V_{ON}$ from the selection scanning line $X_i$ so that the voltage from the selection scanning line $X_i$ is applied to the gate of the transistor 23. Simultaneously, the transistor 21 of each of the pixels $P_{i,1}$ to $P_{i,n}$ is turned on. In addition, the transistor 23 of each of the pixels $P_{i,1}$ to $P_{i,n}$ is turned on by the gate voltage applied by the transistor 22 during the selection period $T_{SE}$. Hence, the data driver 3 supplies a gray level designation current $I_{DATA}$ to the paths between the drains 23d and the sources 23s of the transistors 23 of the pixels $P_{i,1}$ to $P_{i,n}$ and signal lines $Y_1$ to $Y_n$ in the direction indicated by the arrow in FIG. 12A. The current value of the gray level designation current $I_{DATA}$ at this time corresponds to the gray level of a red digital gray level image signal $S_R$, green digital gray level image signal $S_G$, and blue digital gray level image signal $S_B$ input to the data driver 3. Charges corresponding to the current value of the gray level designation current $I_{DATA}$ are stored in capacitors 24 connected to the paths between the gates 23g and the sources 23s of the transistors 23 of the pixels $P_{i,1}$ to $P_{i,n}$ during the selection period $T_{SE}$.

Figure 12B:
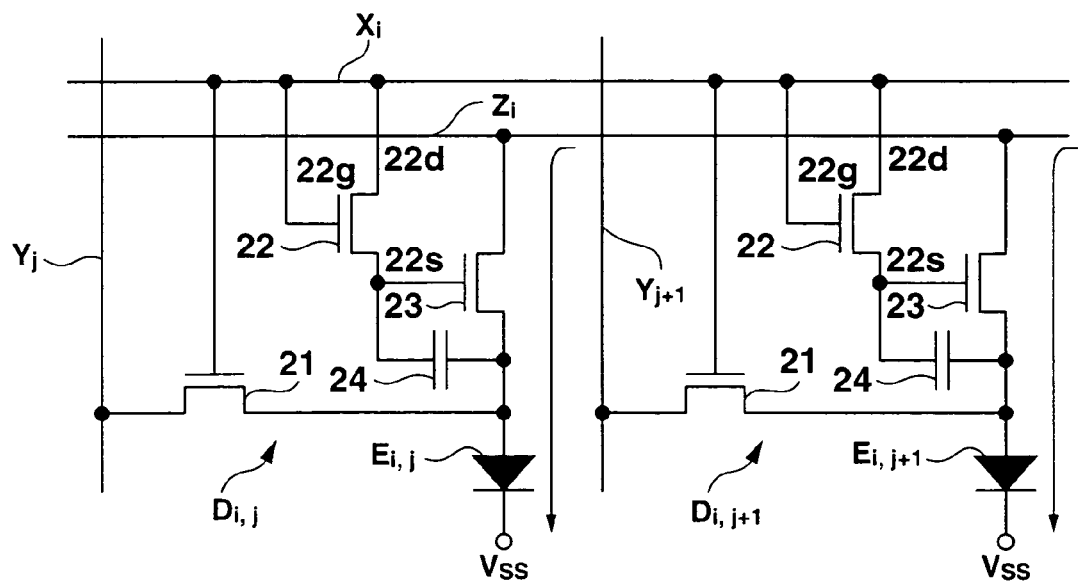

During a non-selection period $T_{NSE}$, the transistor 21 and transistor 22 of each of the pixels $P_{i,1}$ to $P_{i,n}$ are turned off by a scanning signal of an OFF-level voltage $V_{OFF}$ supplied to the selection scanning line $X_i$. A voltage $V_{HIGH}$ is applied to all common signal supply lines $Z_1$ to $Z_m$. For this reason, the voltages between the sources 23s and the drains 23d of all the transistors 23 are saturated. The voltages between the gates 23g and the sources 23s of all the transistors 23 have a voltage value corresponding to the charges stored in the capacitors 24 during the selection period $T_{SE}$. As shown in FIG. 12B, a driving current having a current value equal to the gray level designation current $I_{DATA}$ flows between the sources 23s and the drains 23d of all the transistors 23. Since the voltage $V_{HIGH}$ is much higher than a reference voltage $V_{SS}$, the driving current flows in the direction indicated by the arrow in FIG. 12A to cause light-emitting elements $E_{1,1}$ to $E_{m,n}$ to emit light.

The present invention is not limited to the above embodiments. Various changes and modifications of design may be done without departing from the spirit and scope of the invention.

For example, in the above embodiments, all the first transistor 21, second transistor 22, and third transistor 23 of the pixel circuit $D_{i,j}$ are N-channel transistors. However, all the transistors may be formed from P-channel transistors, and the anode and cathode of the light-emitting element $E_{i,j}$ may be connected in the reverse direction. At this time, the waveforms shown in FIG. 8 are inverted.

Figure 13:
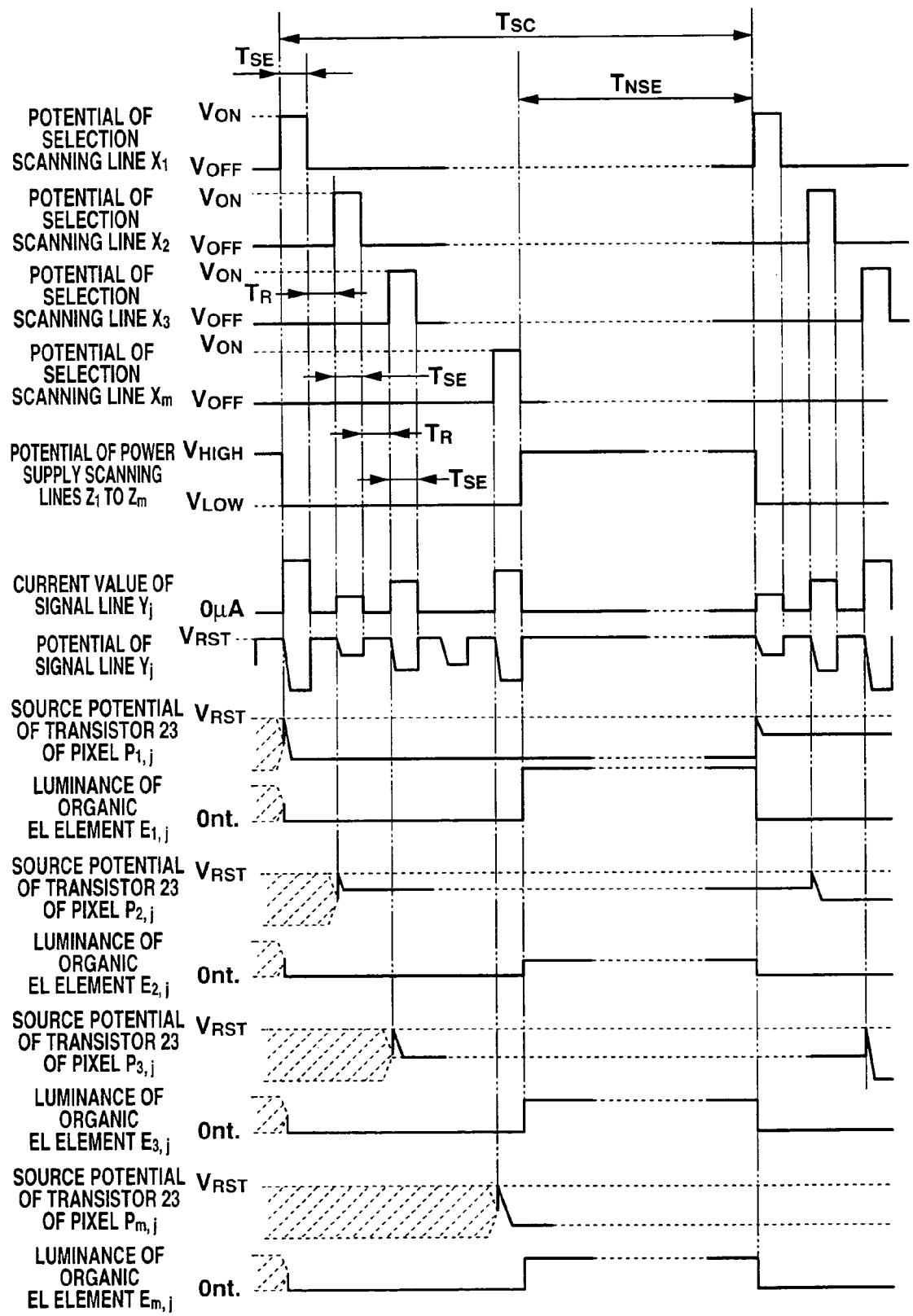
FIG. 13 is a timing chart showing the levels of signals in the apparatus according to the third embodiment.

In the embodiments, the light-emitting period of the light-emitting elements $E_{1,1}$ to $E_{m,n}$ is the non-selection period $T_{NSE}$ between the selection periods $T_{SE}$. the light-emitting period of the light-emitting element $E_{i,j}$ is the m discontinuous non-selection periods $T_{NSE}$ between the selection period $T_{SE}$ of the ith row and the selection period $T_{SE}$ of the next ith row. As shown in FIG. 13, all the light-emitting elements $E_{1,1}$ to $E_{m,n}$ may be simultaneously caused to emit light during the non-selection period $T_{NSE}$ after charges by the gray level designation current $I_{DATA}$ are written in the capacitors 24 of all the light-emitting elements $E_{1,1}$ to $E_{m,n}$. At this time, when at least one of the selection period $T_{SE}$ during one scanning period $T_{SC}$ and (m−1) reset periods $T_R$ when the reset voltage $V_{RST}$ is applied to the signal lines $Y_1$ to $Y_n$ is set to be short, the non-selection period $T_{NSE}$, i.e., the light-emitting period of the light-emitting elements $E_{1,1}$ to $E_{m,n}$ can be made relatively long. Referring to FIG. 13, after the selection scanning line $X_m$ is selected, to return the charges stored in the parasitic capacitances of the signal lines $Y_1$ to $Y_n$ in the write mode of the pixels $P_{m,1}$ to $P_{m,n}$ of the selection scanning line $X_m$, the reset voltage $V_{RST}$ may be applied to increase the number of reset periods $T_R$ during one scanning period $T_{SC}$ to m.

In the above embodiments, an organic EL element is used. However, any other light-emitting element having rectification properties may be used. That is, the light-emitting element may be an element which flows no current when a reverse bias voltage is applied but flows a current when a forward bias voltage is applied, and also emits light at a luminance correspondence with the magnitude of the flowing current. An example of a light-emitting element having rectification properties is an LED (Light Emitting Diode) element.

In the above embodiments, the data driver 3 and selection scanning driver 5 operate on the basis of a clock signal input from the controller 11. However, the clock signal CK3 that is output from the common signal power supply 6 and used as a common signal may be input to the selection scanning driver 5 as the clock signal CK2.

In the above embodiments, the number of times the common signal output from the common signal power supply 6 changes to low level, i.e., the gray level designation current $I_{DATA}$ is supplied is one per selection period $T_{SE}$. However, the number of times may be two or more per selection period $T_{SE}$.

According to the present invention, when a driving current flows to the light-emitting element, the light-emitting element emits light. The current value of the driving current corresponds to the voltage held between the gates 23g and the source 23s of the transistor 23 of the pixel circuit. The voltage value is obtained by converting the current value of the designation current. For these reasons, the current value of the driving current coincides with the current value of the designation current. The light-emitting element emits light at a luminance depending on the current value of the designation current. That is, the light-emitting element emits light at a luminance set by the current value of the designation current. Hence, if the current value of the designation current does not change between pixels, the luminance does not vary between the plurality of light-emitting elements, and a high-quality image can be displayed.

It is only the scanning driver 5 that supplies a selection signal to each scanning line. No drivers for scanning are arranged at all. In addition, the common signal power supply 6 has a smaller number of elements than that of the scanning driver and therefore has a simple arrangement. Hence, the mounting area of the driver is small.

The invention claimed is:

1. A display device comprising:
    a plurality of scanning lines arranged in a plurality of rows;
    a plurality of signal lines arranged in a plurality of columns;
    a scanning driver which sequentially supplies to the scanning lines selection signals that respectively select the scanning lines;
    a data driver which supplies a designation current to said plurality of signal lines within a selection period when one of the scanning lines is being selected;

a plurality of pixel circuits which are arranged in a plurality of rows and a plurality of columns, and each of which supplies a driving current corresponding to a current value of the designation current that flows to the signal lines;

a plurality of optical elements which emit light in accordance with the driving current supplied by said plurality of pixel circuits; and a power supply which selectively outputs a designation current reference voltage to said plurality of pixel circuits in the plurality of rows within the selection period and outputs to said plurality of pixel circuits in the plurality of rows a driving current reference voltage to supply the driving current within a non-selection period;

wherein the optical elements have respective first electrodes connected to the power supply through the pixel circuits and a second electrode to which a reference voltage is applied; and wherein the power supply selectively outputs the driving current reference voltage and the designation current reference voltage to supply the designation current, and the driving current reference voltage is not less than the reference voltage applied to the second electrode of the optical element, and the designation current reference voltage is not more than the reference voltage applied to the second electrode of the optical element.

2. A display device according to claim 1, wherein the non-selection period is a period when none of said plurality of optical elements are selected.

3. A display device according to claim 1, wherein a reset voltage is output to said plurality of signal lines within the non-selection period.

4. A display device according to claim 1, wherein the designation current reference voltage is lower than the driving current reference voltage.

5. A display device according to claim 1, wherein the data driver supplies the designation current to the signal lines and the pixel circuits based on the designation current reference voltage output from the power supply within the selection period, and wherein each of the pixel circuits stores the current value of the designation current and supplies the driving current that is equal to the current value of the designation current based on the driving current reference voltage output from the power supply.

6. A display device according to claim 1, wherein each of the pixel circuits comprises a driving transistor and a capacitor which is connected between a gate and a source of the driving transistor, wherein the data driver supplies the designation current to the signal lines and the driving transistors of the pixel circuits based on the designation current reference voltage output from the power supply within the selection period, and wherein the capacitor stores charges corresponding to the designation current between the gate and the source, and when the driving current reference voltage is input from the power supply, the driving transistor supplies the driving current corresponding to the charges stored between the gate and the source.

7. A display device according to claim 1, wherein each of the pixel circuits comprises:

a first transistor in which a gate is connected to one of the scanning lines and one of a drain and a source is connected to one of the signal lines, a second transistor in which a gate is connected to said one of the scanning lines and the designation current reference voltage and the driving current reference voltage are selectively input to one of a drain and a source, and a driving transistor in which: a gate is connected to the other of the drain and the source of the second transistor, one of a drain and a source is connected to one of the drain and the source of the second transistor, and the other of the drain and the source is connected to the other of the drain and the source of the first transistor and the optical element.

8. A display device according to claim 7, wherein the scanning driver selects the first transistor and the second transistor, which are connected to said one of the scanning lines, within the selection period.

9. A display device according to claim 1, wherein each of the pixel circuits comprises:

a first transistor in which a gate is connected to one of the scanning lines and one of a drain and a source is connected to one of the signal lines, a second transistor in which a gate is connected to said one of the scanning lines and one of a drain and a source is connected to said one of the scanning lines, and a driving transistor in which: a gate is connected to the other of the drain and the source of the second transistor, one of a drain and a source is connected to the power supply, and the other of the drain and the source is connected to the other of the drain and the source of the first transistor and the optical element.

10. A display device according to claim 9, wherein the scanning driver selects the first transistor and the second transistor, which are connected to said one of the scanning lines, within the selection period.

11. A display device according to claim 1, wherein the power supply outputs the driving current reference voltage from the end of the selection period of a predetermined scanning line until the beginning of the selection period of a next scanning line.

12. A display device according to claim 1, wherein the optical elements comprise organic EL elements.

13. A display device comprising:

a scanning line group including a scanning line of a first row and a scanning line of a second row;

a signal line group including a signal line of a first column which flows a first designation current and a signal line of a second column which flows a second designation current;

an optical element group including a first optical element which is connected to the scanning line of the first row and emits light in accordance with a current value of a first driving current supplied thereto, and a second optical element which is connected to the scanning line of the second row and emits light in accordance with a current value of a second driving current supplied thereto;

a pixel circuit group including a first pixel circuit which is connected to the first optical element and supplies the first driving current, the current value of which is equal to a current value of the first designation current, which is supplied thereto, and a second pixel circuit which is connected to the second optical element and supplies the second driving current, the current value of which is equal to a current value of the second designation current, which is supplied thereto; and a power supply which applies a designation current reference voltage to both the first pixel circuit and the second pixel circuit within a selection period, and which applies a driving current reference voltage to both the first pixel circuit and the second pixel circuit within a non-selection period so that the first pixel circuit supplies the first driving current to the first optical element and the second pixel circuit supplies the second driving current to the second optical element;

wherein the optical elements have respective first electrodes connected to the power supply through the pixel circuits corresponding thereto and a second electrode to which a reference voltage is applied; and wherein the power supply selectively outputs the driving current reference voltage and the designation current reference voltage to supply the first and second designation currents, and the driving current reference voltage is not less than the reference voltage applied to the second electrode of the optical elements, and the designation current reference voltage is not more than the reference voltage applied to the second electrode of the optical elements.

14. A display device according to claim 13, wherein the non-selection period is a period when none of the optical elements of the optical element group are selected.

15. A display device according to claim 13, wherein a reset voltage is output to said plurality of signal lines within the non-selection period.

16. A display device according to claim 13, wherein the designation current reference voltage is lower than the driving current reference voltage.

17. A display device according to claim 13, further comprising a data driver which supplies the first and second designation currents to the first and second pixel circuits based on the designation current reference voltage output from the power supply within the selection period.

18. A display device according to claim 17, wherein the signal line group connects the data driver to the pixel circuits.

19. A display device according to claim 17, wherein each of the pixel circuits comprises:

a first transistor in which a gate is connected to one scanning line of the scanning line group and one of a drain and a source is connected to the data driver, a second transistor in which a gate is connected to the one scanning line and the designation current reference voltage and the driving current reference voltage are selectively input to one of a drain and a source, and a driving transistor in which: a gate is connected to the other of the drain and the source of the second transistor, one of a drain and a source is connected to one of the drain and the source of the second transistor, and the other of the drain and the source is connected to the other of the drain and the source of the first transistor and one optical element of the optical element group.

20. A display device according to claim 19, further comprising a selection scanning driver which selects the first transistor and the second transistor, which are connected to the one scanning line of the scanning line group within the selection period.

21. A display device according to claim 17, wherein each of the pixel circuits comprises:

a first transistor in which a gate is connected to one scanning line of the scanning line group and one of a drain and a source is connected to the data driver, a second transistor in which a gate is connected to the one scanning line and one of a drain and a source is connected to the one scanning line, and a driving transistor in which: a gate is connected to the other of the drain and the source of the second transistor, one of a drain and a source is connected to the power supply, and the other of the drain and the source is connected to the other of the drain and the source of the first transistor and one optical element of the optical element group.

22. A display device according to claim 21, further comprising a selection scanning driver which selects the first transistor and the second transistor, which are connected to the one scanning line of the scanning line group within the selection period.

23. A display device according to claim 13, wherein each of the pixel circuits stores the current value of the designation current supplied thereto within the selection period and supplies the driving current that is equal to the current value of the designation current based on the driving current reference voltage output from the power supply after the selection period.

24. A display device according to claim 13, wherein each of the pixel circuits comprises a driving transistor and a capacitor which is connected between a gate and a source of the driving transistor, wherein a data driver supplies the respective designation currents to the driving transistors of the pixel circuits based on the designation current reference voltage output from the power supply within the selection period, and wherein the capacitor of each of the pixel circuits stores charges corresponding to the designation current supplied to the pixel circuit between the gate and the source of the driving transistor of the pixel circuit, and when the driving current reference voltage is input from the power supply, the driving transistor supplies the driving current corresponding to the charges stored between the gate and the source.

25. A display device according to claim 13, wherein the power supply outputs the driving current reference voltage within the non-selection period between the selection period of a predetermined scanning line and the selection period of a next scanning line.

26. A display device according to claim 13, wherein the optical elements comprise organic elements.

27. A display device driving method comprising:

supplying a first designation current to a first driving transistor within a first selection period to store charges corresponding to a current value of the first designation current between a gate and a source of the first driving transistor;

supplying a second designation current to a second driving transistor within a second selection period to store charges corresponding to a current value of the second designation current between a gate and a source of the second driving transistor; and from an end of the first selection period until a beginning of the second selection period, (i) outputting a driving current reference voltage to the first driving transistor and a first optical element which is connected in series with the first driving transistor, and (ii) outputting the driving current reference voltage to the second driving transistor and a second optical element which is connected in series with the second driving transistor; and applying a designation current reference voltage to both the first driving transistor and the second driving transistor in the first selection period and the second selection period;

wherein the driving current reference voltage is a voltage at which a source-drain voltage of the first driving transistor and a source-drain voltage of the second driving transistor are set in a saturated state.

28. A display device driving method comprising:

supplying a first designation current to a first driving transistor within a first selection period to store charges corresponding to a current value of the first designation current between a gate and a source of the first driving transistor;

supplying a second designation current to a second driving transistor within a second selection period after supplying the first designation current to store charges corresponding to a current value of the second designation current between a gate and a source of the second driving transistor; and after supplying the second designation current, outputting a driving current reference voltage to the first driving transistor and a first optical element which is connected in series with the first driving transistor, and outputting the driving current reference voltage to the second driving transistor and a second optical element which is connected in series with the second driving transistor;

applying a designation current reference voltage to both the first driving transistor and the second driving transistor in the first selection period and the second selection period;

wherein the driving current reference voltage is a voltage at which a source-drain voltage of the first driving transistor and a source-drain voltage of the second driving transistor are set in a saturated state.

* * * * *